(12) United States Patent
Masuda

(10) Patent No.: US 8,483,640 B2
(45) Date of Patent: Jul. 9, 2013

(54) TELEVISION BROADCAST RECEIVING APPARATUS, CONTROL METHOD AND CONTROL PROGRAM FOR TELEVISION BROADCAST RECEIVING APPARATUS, AND RECORDING MEDIUM HAVING THE CONTROL PROGRAM RECORDED THEREON

(75) Inventor: Shigeto Masuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 301 days.

(21) Appl. No.: 12/947,987

(22) Filed: Nov. 17, 2010

(65) Prior Publication Data
US 2011/0122258 A1 May 26, 2011

(30) Foreign Application Priority Data
Nov. 25, 2009 (JP) ................. 2009-266974

(51) Int. Cl.
*H04B 1/06* (2006.01)

(52) U.S. Cl.
USPC ........... 455/260; 455/130; 455/207; 455/209; 455/226.2; 348/731; 375/240.01; 375/346; 375/376

(58) Field of Classification Search
USPC .......... 455/78, 130, 134, 165.1, 180.3, 190.1, 455/207, 209, 226.2, 260, 323; 348/731; 375/240.01, 346, 376
See application file for complete search history.

(56) References Cited

U.S. PATENT DOCUMENTS

| | | | |
|---|---|---|---|
| 6,650,878 B1 | 11/2003 | Abe et al. | |
| 2009/0128240 A1 | 5/2009 | Miyagi | |

FOREIGN PATENT DOCUMENTS

| | | |
|---|---|---|
| CN | 101263651 A | 9/2008 |
| JP | 2-170648 A | 7/1990 |
| JP | 2001-102947 A | 4/2001 |
| JP | 2002-9645 A | 1/2002 |
| JP | 2006-50585 A | 2/2006 |
| JP | 2006-203530 A | 8/2006 |
| JP | 2009-200571 A | 9/2009 |

OTHER PUBLICATIONS

Japanese Office Action mailed Jan. 17, 2012 with English Translation.
Korean Office Action mailed Feb. 23, 2012 with English translation.

*Primary Examiner* — Tuan Pham
(74) *Attorney, Agent, or Firm* — Birch, Stewart, Kolasch & Birch, LLP

(57) ABSTRACT

A television broadcast receiving apparatus can change an oscillation frequency of a local oscillation signal or a tuning frequency of an intermediate frequency signal in a reception channel, and changes the reception characteristic to an optimum reception characteristic. In this way, the television broadcast receiving apparatus effectively reduces SN ratio deterioration due to interference of the outside of a reception band such as adjacent channel interference.

2 Claims, 20 Drawing Sheets

FIG.2

| | LOCAL OSCILLATION FREQUENCY | | | | | | |
|---|---|---|---|---|---|---|---|
| | -2.8MHz | -2MHz | -1MHz | 0Hz | +1MHz | +2MHz | +2.8MHz |
| SN RATIO MEASUREMENT VALUE | 32dB | 32dB | 32dB | 33dB | 34dB | 36dB | 38dB |

FIG.5

| | FILTER UNIT'S TUNING FREQUENCY | | | | | | |
|---|---|---|---|---|---|---|---|
| | -2.8MHz | -2MHz | -1MHz | 0Hz | +1MHz | +2MHz | +2.8MHz |
| SN RATIO MEASUREMENT VALUE | 38dB | 36dB | 34dB | 33dB | 32dB | 32dB | 32dB |

TELEVISION BROADCAST RECEIVING APPARATUS, CONTROL METHOD AND CONTROL PROGRAM FOR TELEVISION BROADCAST RECEIVING APPARATUS, AND RECORDING MEDIUM HAVING THE CONTROL PROGRAM RECORDED THEREON

This nonprovisional application is based on Japanese Patent Application No. 2009-266974 filed on Nov. 25, 2009 with the Japan Patent Office, the entire contents of which are hereby incorporated by reference.

BACKGROUND OF THE INVENTION

1. Field of the Invention

The present invention relates to a television broadcast receiving apparatus, and particularly to reduction of SN (Signal to Noise) ratio deterioration due to an interfering signal interfering with a channel being watched in the case of receiving digital terrestrial television broadcasting.

2. Description of the Background Art

Regarding the terrestrial television broadcasting in Japan, analog broadcasting is officially scheduled to be terminated and completely shifted to digital broadcasting in July 2011. Currently, simulcast (simultaneous broadcasting) of simultaneously providing analog broadcasting and digital broadcasting is performed as a transitional measure. Therefore, for receiving apparatuses receiving broadcasts in the transitional period in which the broadcasting system is to be changed, there is an increasing demand for resistance to interferences such as interference of an analog broadcast channel with a digital broadcast channel being received, contrary interference of a digital broadcast channel with an analog broadcast channel being received, and interference of another digital broadcast channel with the digital broadcast channel being received. Even when the analog broadcasting has been terminated and only the digital broadcasting is provided, the broadcast waves for the digital broadcasting are permitted to be arranged with a channel spacing of 6 MHz without vacant frequency band, and therefore, the demand for resistance to interferences between channels will not be mitigated in the future as well, due to increase of the broadcast stations.

FIG. 19 is a block diagram showing a conventional digital broadcast receiving apparatus 90. In the following, a general operation of the conventional digital broadcast receiving apparatus will be described.

A broadcast signal from a broadcast station is input to an input terminal 1, passed through a bandpass filter 2 allowing a frequency of a desired channel to pass, and amplified by a variable gain amplifier 3 to an appropriate value. After this, the signal is passed again through a bandpass filter 4 tuning the frequency of the desired channel, and input to a mixer 5. Mixer 5 constitutes a frequency conversion unit 21 together with a local oscillator 20. The input signal to mixer 5 is mixed with an output signal of local oscillator 20, and is output as a sum and difference signal generated by mixing in the frequency range. An intermediate frequency filter 6 allows only a difference component of the output signal of mixer 5 to pass. The resultant output signal is called intermediate frequency signal. The intermediate frequency signal is first amplified by an amplifier 7, and then input to a SAW (Surface Acoustic Wave) filter 8 and also detected by an AGC (Auto Gain Control) detector 18. The resultant detection output signal controls the degree of amplification of variable gain amplifier 3. Here, control of the degree of amplification of variable gain amplifier 3 will be described in more detail. When the reception input level to input terminal 1 increases and the output level of amplifier 7 exceeds a specified value, the gain of variable gain amplifier 3 is reduced. When the output level of amplifier 7 goes below the specified value, the gain of variable gain amplifier 3 is increased. In this way, a gain control operation of keeping constant the output level of amplifier 7 is performed. Accordingly, the resistance to interference when the reception input level is high and a favorable SN ratio when the reception input level is low are achieved together.

Next, the intermediate frequency signal with the frequency band limited by SAW filter 8 is appropriately amplified by a variable gain amplifier 9, passed through a bandpass filter 10, and converted by an A/D (Analog to Digital) converter 11 to an input signal to a demodulation unit 12. A level detector 16 detects the output signal of A/D converter 11. From the resultant detection output signal, a control signal is generated by an AGC control signal generation unit 17, and by the control signal, variable gain amplifier 9 adjusts its degree of amplification so that the input level to demodulation unit 12 is made constant. Demodulation unit 12 includes an SN ratio detection unit 13. The detection value of SN ratio detection unit 13 is transmitted to an operation unit 14 and may be used for an on-screen display capability of a receiver (not shown). A storage unit 15 may be used for temporary storage for the above-described display capability or the like. Operation unit 14 transmits through a bus 22 oscillation frequency setting data to a PLL (Phase Locked Loop) unit 19 for controlling the oscillation frequency of local oscillator 20.

Here, the output level of amplifier 7 when the above-described gain control operation for variable gain amplifier 3 is started is generally called takeover point. FIG. 20 is provided for explaining the takeover point, and illustrates that variable gain amplifier 9 reaches a specified gain attenuation amount and thereafter variable gain amplifier 3 starts a gain attenuation operation. This takeover point is set in a trade-off manner to an appropriate value in consideration of the interference characteristic and the SN ratio, and the set value does not change in most cases. The actual reception environment, however, varies depending on the reception area and the condition under which the receiver is installed, for example, and the set value is not necessarily optimum. In such a case, the level of the interference characteristic deteriorates to be lower than a level expected in advance, and the deterioration of the interference characteristic could cause the SN ratio to deteriorate as well.

In order to lessen these disadvantages, Patent Document 1 (Japanese Patent Laying-Open No. 2001-102947 published on Apr. 13, 2001) and Patent Document 2 (Japanese Patent Laying-Open No. 2006-50585 published on Feb. 16, 2006) propose respective techniques. The technique of Patent Document 1 changes, depending on the reception quality, a switch level value between a gain control operation for an intermediate frequency amplification circuit and a gain control operation for a high-frequency amplification circuit, and sets the takeover point to an optimum point all the time. The technique of Patent Document 2 detects the reception state for each channel, sets the takeover point to the one that provides an optimum reception state for a detected input high-frequency signal for each channel, and updates and sets the takeover point to the one that provides an optimum reception state at the timing that does not influence watching.

As seen from the above, regarding ensured reception performance by means of gain control, the conventional techniques are generally classified into the one that fixes the takeover point to a tolerable limit for actual use, and the one that provides optimum setting in accordance with the reception channel and the reception quality. Meanwhile, the reception performance is considerably influenced by, in addition to the reception environment condition as described above, variation of the characteristics of the receiving apparatus itself. In particular, bandpass filters 2, 4 included in receiving apparatus 90 of FIG. 19 are tuned for each reception channel for generating the intermediate frequency signal between them and local oscillator 20. Since this tuning varies depending on the reception channel, the frequency response of a reception channel could be smaller than the frequency response of an adjacent channel in an extreme case. In the case of Japan for example, when a broadcast signal with a center frequency of 509.142857 MHz is input and an intermediate frequency signal of 57 MHz is to be obtained, the frequency is converted with the oscillation frequency of local oscillator 20 that is the sum of the aforementioned frequencies of 566.142857 MHz. Although the tuning frequency of bandpass filters 2, 4 should be tuned to 509.142857 MHz that is the center frequency of the broadcast signal, when the tuning frequency is for example 515.142857 MHz, the peak of the intermediate frequency signal output characteristic is deviated to 54 MHz (hereinafter tracking error), and the frequency response of the adjacent channel is enhanced. In such a case, with the sole takeover point setting of the conventional techniques, not only optimization of the reception characteristics but also an ensured tolerable limit for actual use could be difficult to achieve.

FIG. 21 illustrates an example of the above-described case, in which an interfering signal of an analog broadcast is present adjacent to a desired reception signal of a digital broadcast. In FIG. 21, the horizontal axis of each graph represents the frequency and, for input and output signals both, the center frequency is indicated as a reference (0 Hz). The vertical axis of each graph represents the amplitude of a signal that is indicated as a relative level with respect to a reference (0 dB) of an input signal level.

In FIG. 21(*a*), a difference in amplitude level between the desired signal of the digital broadcast and the interfering signal of the analog broadcast is 15 dB, and the signals are input to input terminal 1 of television broadcast receiving apparatus 90 in FIG. 19. In FIG. 21(*b*), with respect to the frequency of the desired reception channel, there is no tracking error between the tuning frequency of the bandpass filters 2, 4 and the oscillation frequency of local oscillator 20. Accordingly, as shown in FIG. 21(*c*), the output signal spectrum of bandpass filters 6, 10 does not deviate from the center frequency of the intermediate frequency signal and, with respect to the amplitude level of the center frequency, the desired signal is not attenuated and the interfering signal is suppressed. In contrast, in the case as shown in FIG. 21(*d*) in which there is a tracking error between the tuning frequency of bandpass filters 2, 4 and the oscillation frequency of local oscillator 20 when the desired reception channel is received, the output frequency characteristic of bandpass filters 6, 10 deviates from the center frequency of the intermediate frequency signal. Then, regarding the output signal spectrum of bandpass filters 6, 10, the desired signal as shown in FIG. 21(*e*) is attenuated with respect to the amplitude level of the center frequency and the interfering signal is not suppressed. Thus, the difference of the amplitude level increases, which leads to deterioration of the SN ratio.

SUMMARY OF THE INVENTION

In view of the problems above, a chief object of the present invention is to improve the resistance to interference by an interfering wave outside the frequency band of a reception channel that cannot be avoided by the sole setting of the takeover point, and improve the SN ratio.

A television broadcast receiving apparatus according to the present invention includes, for solving the problems above, a PLL unit for controlling a frequency of a local oscillation signal in a reception channel, a frequency conversion unit generating an intermediate frequency signal by using the local oscillation signal, a filter unit configured to be tuned to a frequency band of the intermediate frequency signal, a demodulation unit demodulating the intermediate frequency signal passed through the filter unit, an SN ratio measurement unit measuring an SN ratio of the demodulated signal generated by the demodulation, and an operation unit controlling the PLL unit. The operation unit determines the frequency of the local oscillation signal that renders the SN ratio favorable in a range corresponding to an occupied frequency bandwidth of the reception channel and, based on a result of the determination, changes the frequency control signal for the local oscillation signal that is output from the PLL unit.

A television broadcast receiving apparatus according to the present invention includes a PLL unit controlling a frequency of a local oscillation signal in a reception channel, a frequency conversion unit generating an intermediate frequency signal by using the local oscillation signal, a filter unit configured to be tuned to a frequency band of the intermediate frequency signal, a demodulation unit demodulating the intermediate frequency signal passed through the filter unit, an SN ratio measurement unit measuring an SN ratio of the demodulated signal generated by the demodulation, an operation unit controlling the PLL unit, and a filter control unit for controlling a tuning frequency of the filter unit. The operation unit determines the tuning frequency of the filter unit that renders the SN ratio favorable in a range corresponding to an occupied frequency bandwidth of the reception channel and, based on a result of the determination, changes the tuning frequency control signal for the filter unit that is output from the filter control unit.

The television broadcast receiving apparatus according the present invention further includes a demodulation lock detection unit detecting a lock state or an unlock state of the demodulation unit. From a result of the detection of the demodulation lock detection unit, the operation unit determines a transition probability from the lock state to the unlock state, and the operation unit selects an optimum setting of the SN ratio from frequencies of the local oscillation signal or tuning frequencies of the filter unit that provide respective transition probabilities falling within a predetermined range.

The television broadcast receiving apparatus according to the present invention further includes a storage unit temporarily storing the SN ratio and setting data about the frequency of the local oscillation signal that renders the SN ratio optimum, or setting data about the tuning frequency of the filter unit that renders the SN ratio optimum.

The filter unit includes at least one variable capacity diode. The filter control unit is a D/A (Digital to Analog) conversion unit converting setting data about the tuning frequency of the filter unit that is provided from the operation unit and renders the SN ratio optimum, into a DC voltage applied to the variable capacity diode.

The filter unit includes a plurality of capacitors, and a plurality of switches allowing the capacitors to be connected or non-connected to the filter unit. The filter control unit is a switch control unit converting setting data about the tuning frequency of the filter unit that is provided from the operation unit, into an open and close control signal for the plurality of switches.

The television broadcast receiving apparatus according to the present invention further includes a bus transmitting synthetic data of setting data about the frequency of the local oscillation signal that renders the SN ratio favorable, and setting data about the tuning frequency of the filter unit that renders the SN ratio favorable, and a separation unit separating the synthetic data into the setting data about the frequency of the local oscillation signal and the setting data about the tuning frequency of the filter unit.

A television broadcast reception method according to the present invention includes the steps of shifting a frequency of a local oscillation signal in a reception channel, measuring, after frequency conversion and demodulation are performed, an SN ratio of a demodulated signal generated by the demodulation, determining that local oscillation frequency shifting has been performed in a range corresponding to an occupied frequency bandwidth of the reception channel, and changing, based on a result of the determination, a control setting for the frequency of the local oscillation signal that is output by the step of shifting.

A television broadcast reception method according to the present invention includes the steps of shifting a tuning frequency of an intermediate frequency filter in a reception channel, measuring, after frequency conversion and demodulation are performed, an SN ratio of a demodulated signal generated by the demodulation, determining that intermediate-frequency-filter tuning frequency shifting has been performed in a range corresponding to an occupied frequency bandwidth of the reception channel, and changing, based on a result of the determination, a control setting for the tuning frequency of the intermediate frequency filter that is output by the step of shifting.

The television broadcast reception method according to the present invention further includes the step of detecting a lock state or an unlock state of the demodulation. The step of changing determines, from a result of the detection by the detecting step, a transition probability from the lock state to the unlock state, and selects an optimum setting of the SN ratio, from the control setting that provides the transition probability in a predetermined range.

A control program for a television broadcast receiving apparatus according to the present invention includes the steps of shifting a frequency of a local oscillation signal in a reception channel, measuring, after frequency conversion and demodulation are performed, an SN ratio of a demodulated signal generated by the demodulation, determining that local oscillation frequency shifting has been performed in a range corresponding to an occupied frequency bandwidth of the reception channel, and changing, based on a result of the determination, a control setting for the frequency of the local oscillation signal that is output by the step of shifting.

A control program for a television broadcast receiving apparatus according to the present invention includes the steps of shifting a tuning frequency of an intermediate frequency filter in a reception channel, measuring, after frequency conversion and demodulation are performed, an SN ratio of a demodulated signal generated by the demodulation, determining that intermediate-frequency-filter tuning frequency shifting has been performed in a range corresponding to an occupied frequency bandwidth of the reception channel, and changing, based on a result of the determination, a control setting for the tuning frequency of the intermediate frequency filter that is output by the step of shifting.

The control program for a television broadcast receiving apparatus according to the present invention further includes the step of detecting a lock state or an unlock state of the demodulation. The step of changing determines, from a result of the detection by the detecting step, a transition probability from the lock state to the unlock state, and selects an optimum setting of the SN ratio, from the control setting that provides the transition probability in a predetermined range.

The control program for a television broadcast receiving apparatus of the present invention may be a computer-readable recording medium.

According to the present invention, the oscillation frequency of the local oscillation signal corresponding to a received television broadcast signal is shifted by the PLL unit. In order that the SN ratio of the demodulated signal that is measured by the SN ratio measurement unit after the intermediate frequency signal is demodulated may be optimum, the PLL unit is controlled by the setting data from the operation unit. Accordingly, in the case where another broadcast signal is present adjacent to the received television broadcast signal (reception channel) that deteriorates the SN ratio of the reception channel, the center frequency of the intermediate frequency signal with respect to the tuning frequency of the filter unit can be set to a frequency that provides a favorable SN ratio of the reception channel. In particular, this is effective for optimizing the SN ratio of the reception channel in the case where a tracking error occurs in a stage preceding the frequency conversion and the frequency response of another signal adjacent to the reception channel is enhanced relative to the reception channel at the stage of the intermediate frequency signal after the frequency conversion.

Further, according to the present invention, the filter unit for limiting the band of the intermediate frequency signal is controlled with the setting data from the operation unit, so that the SN ratio measured by the SN ratio measurement unit after the demodulation is optimum, and thus the tuning frequency of the filter unit is shifted. Accordingly, in the case where another broadcast signal is present adjacent to the received television broadcast signal (reception channel) that deteriorates the SN ratio of the reception channel, the tuning frequency of the filter unit with respect to the intermediate frequency signal is shifted, and thus the filter unit can be set to a frequency characteristic that provides a favorable SN ratio of the reception channel. In particular, this is effective for optimizing the SN ratio of the reception channel in the case where a tracking error occurs in a stage preceding the frequency conversion and the frequency response of another signal adjacent to the reception channel is enhanced relative to the reception channel at the stage of the intermediate frequency signal after the frequency conversion.

Further, the operation unit determines the transition probability from the demodulation lock state to the demodulation unlock state, from the result of the detection of the demodulation lock by the demodulation lock detection unit, resultant from shifting of the oscillation frequency of the local oscillation signal or shifting of the tuning frequency of the filter unit, and therefore, normal demodulation lock can be maintained while the SN ratio of the reception channel can be set to an optimum SN ratio.

Further, the television broadcast receiving apparatus of the present invention includes the storage unit that temporarily stores the measured SN ratio and the setting data about the frequency of the local oscillation signal that renders the SN ratio optimum or the setting data about the tuning frequency of the intermediate frequency filter unit that renders the SN ratio optimum, and therefore, the optimum SN ratio setting value can be changed or maintained, by shifting the oscillation frequency of the local oscillation signal or shifting the tuning frequency of the filter unit in accordance with the reception environment.

Further, the filter unit uses the variable capacity diode and thus the tuning frequency can be varied finely and successively in a wide range. Therefore, the optimum SN ratio setting for the reception channel can be performed precisely.

Further, the filter unit includes a plurality of fixed capacitors and switches for making a switch of the capacitors. Therefore, in the case where the shift setting value of the tuning frequency that renders the SN ratio optimum can be predicted from a trend, the optimum SN ratio setting of the reception channel can be performed at a relatively low cost.

Further, in the television broadcast receiving apparatus of the present invention, synthetic data of the setting data about the frequency of the local oscillation signal that renders the SN ratio favorable and the setting data about the tuning frequency of the filter unit that renders the SN ratio favorable is used, and the bus for transmitting the synthetic data and the separation unit for separating the synthetic data transmitted by the bus into the setting data are provided. Therefore, extension of the bus is reduced, and the influence of the ambient noise entering the PLL unit and the filter control unit through the bus can be made minimum. Accordingly, respective control precisions of the control units can be enhanced. Moreover, since the local oscillation frequency control and the filter characteristic switch control can be performed simultaneously, the efficient control system can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates an exemplary optimum SN ratio setting in the first embodiment.

FIG. 5 illustrates an exemplary optimum SN ratio setting in the second embodiment.

DESCRIPTION OF THE PREFERRED EMBODIMENTS

First Embodiment

Figure 1:
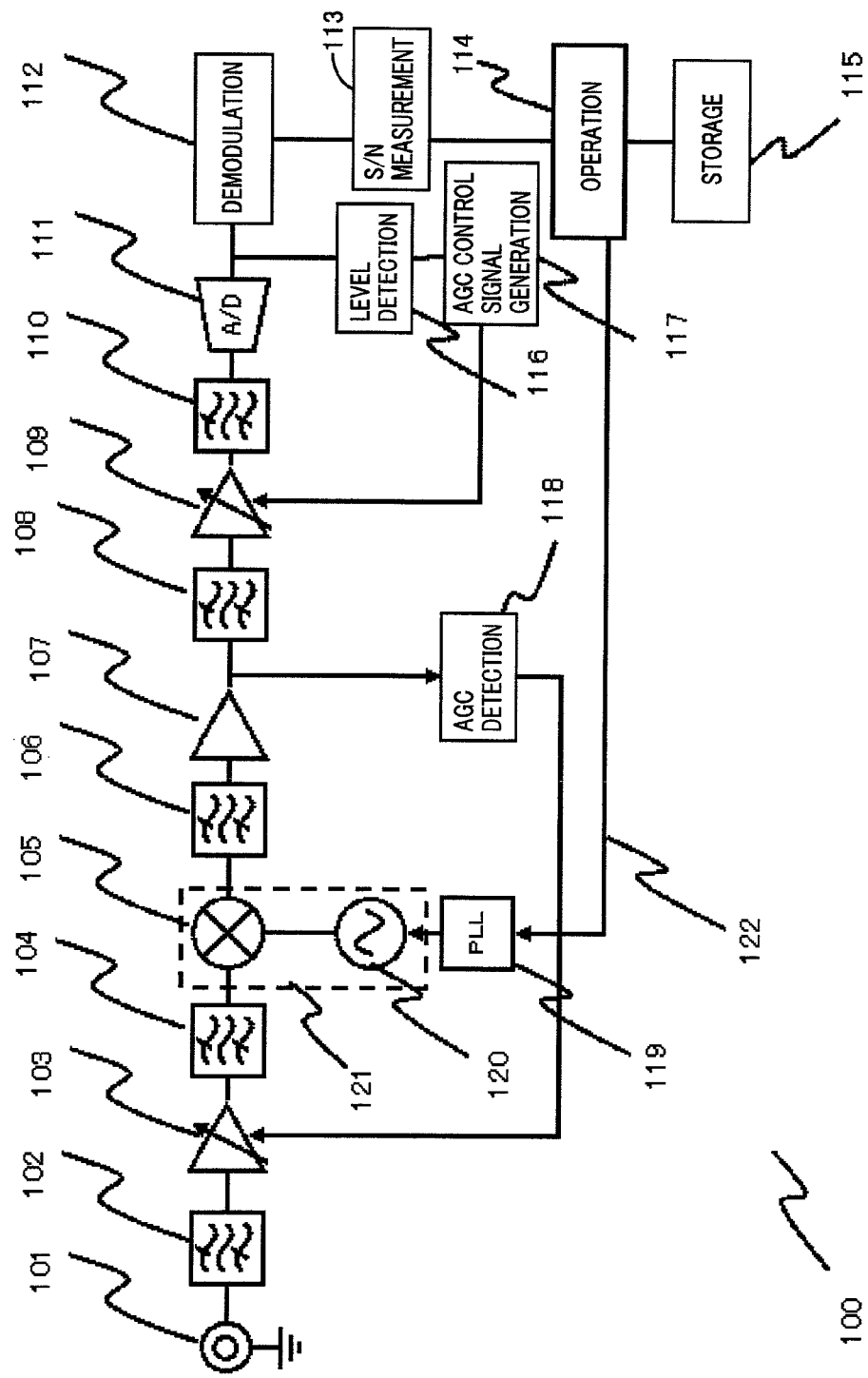
FIG. 1 is a block diagram showing a television broadcast receiving apparatus in a first embodiment of the present invention.

Embodiments of the present invention will hereinafter be described with reference to the drawings. In the drawings, like or corresponding components are denoted by the same reference characters, and a description thereof will not be repeated. FIG. 1 is a block diagram showing a television broadcast receiving apparatus 100 in a first embodiment of the present invention. Here, a television broadcast signal handled by the television broadcast receiving apparatus in the first embodiment of the present invention refers to a signal transmitted in a frequency range of 90 MHz to 770 MHz in the case of Japan.

In television broadcast receiving apparatus 100 of FIG. 1, a broadcast signal from a broadcast station is input to an input terminal 101, passed through a bandpass filter 102 allowing a frequency of a desired channel to pass, and amplified by a variable gain amplifier 103 to an appropriate value. After this, the signal is passed again through a bandpass filter 104 allowing the frequency of the desired channel to pass, and input to a mixer 105. Mixer 105 constitutes a frequency conversion unit 121 together with a local oscillator 120. The input signal to mixer 105 is mixed with an output signal of local oscillator 120 that is controlled by a PLL unit 119 based on oscillation frequency setting data sent from an operation unit 114 through a bus 122, and is output as a sum and difference signal generated by mixing in the frequency range. An intermediate frequency filter 106 allows only a difference component of the output signal of mixer 105 to pass. The resultant output signal is an intermediate frequency signal that is first amplified by an amplifier 107, and then input to a SAW filter 108 and also detected by an AGC detector 118. The resultant detection output signal controls the degree of amplification of variable gain amplifier 103. The signal with the frequency band limited by SAW filter 108 is appropriately amplified by a variable gain amplifier 109, passed through a bandpass filter 110, and converted by an A/D converter 111 to an input signal to a demodulation unit 112. A level detector 116 detects the output signal of A/D converter 111. From the resultant detection output signal, a control signal is generated by an AGC control signal generation unit 117, and by the control signal, variable gain amplifier 109 adjusts its degree of amplification so that the input level to demodulation unit 112 is made constant.

After the above-described operation, demodulation unit 112 demodulates the broadcast signal of the reception channel, and an SN ratio measurement unit 113 outputs an SN ratio measurement value to operation unit 114. Operation unit 114 causes the input SN ratio measurement value and oscillation frequency setting data when this SN ratio measurement value is obtained, to be temporarily stored in a storage unit 115. Storage unit 115 may be provided outside operation unit 114, or a register provided inside operation unit 114 may be used.

Referring next to FIG. 2, a description will be given of shifting of a local oscillation frequency, a relation between the frequency shifting and an SN ratio measured for the shifted frequency, and an operation of performing, based on the result of the measurement, optimum SN ratio setting in a reception channel.

FIG. 2 shows how the SN ratio measurement value changes when the local oscillation frequency is shifted with respect to a local oscillation frequency with which the center frequency of the intermediate frequency signal (57 MHz in the case of Japan) is obtained. Examples of the SN ratio measurement value are shown for respective shifts of the local oscillation frequency where the shift amount at the center is 0 Hz with respect to the center frequency of the intermediate frequency signal, and respective shift amounts in the + direction and the − direction each are 1 MHz, 2 MHz, and 2.8 MHz. Here, in this example, the maximum value of the shift amount is +/−2.8 MHz with respect to the center frequency of the intermediate frequency signal, to comply with an occupied frequency bandwidth of a reception channel. The spacing between the shift amounts may be set to any without being limited by what is specified above. Here, the occupied frequency bandwidth refers to, in the case of the digital terrestrial broadcasting in Japan, a bandwidth occupied by transmission of one channel, and the width is 5.6 MHz in a channel width (or channel spacing) of 6 MHz.

The description will now be given in connection with FIG. 1. Operation unit 114 sends the local oscillation frequency setting data to PLL unit 119, so that the local oscillation frequency shifts by an arbitrary spacing in a reception channel. The arbitrary spacing here is the shift amounts in the + direction and − direction as indicated above. Then, PLL unit 119 uses the local oscillation frequency setting data from operation unit 114 to control the oscillation frequency of local oscillator 120 such that the frequency shifts by the arbitrary spacing as described above. Thus, receiving apparatus 100 performs frequency conversion and demodulation with the shifted local oscillation frequency, and the SN ratio has the value that is obtained when the intermediate frequency signal is shifted by this arbitrary spacing. In the case where the SN ratio measurement value taken after the local oscillation frequency is shifted is better than the SN ratio measurement value stored in storage unit 115, operation unit 114 causes the stored value to be updated to the SN ratio measurement value obtained after the local oscillation frequency is shifted, and the stored data to be updated to local oscillation frequency setting data corresponding to the updated value. After the above-described local oscillation frequency shifting and temporary storage of the SN ratio measurement value are repeated within a shift range of the local oscillation frequency (above-described +/−2.8 MHz) corresponding to the occupied frequency bandwidth of the reception channel, operation unit 114 transmits again to PLL unit 119 the local oscillation frequency setting data providing the optimum SN ratio measurement value as local oscillation frequency setting data providing the optimum SN ratio of the reception channel. Namely, in the example of FIG. 2, the local oscillation frequency setting data providing a local oscillation frequency shift of +2.8 MHz with which an SN ratio measurement value of 38 dB is obtained is transmitted from operation unit 114 to PLL unit 119.

Figure 3:
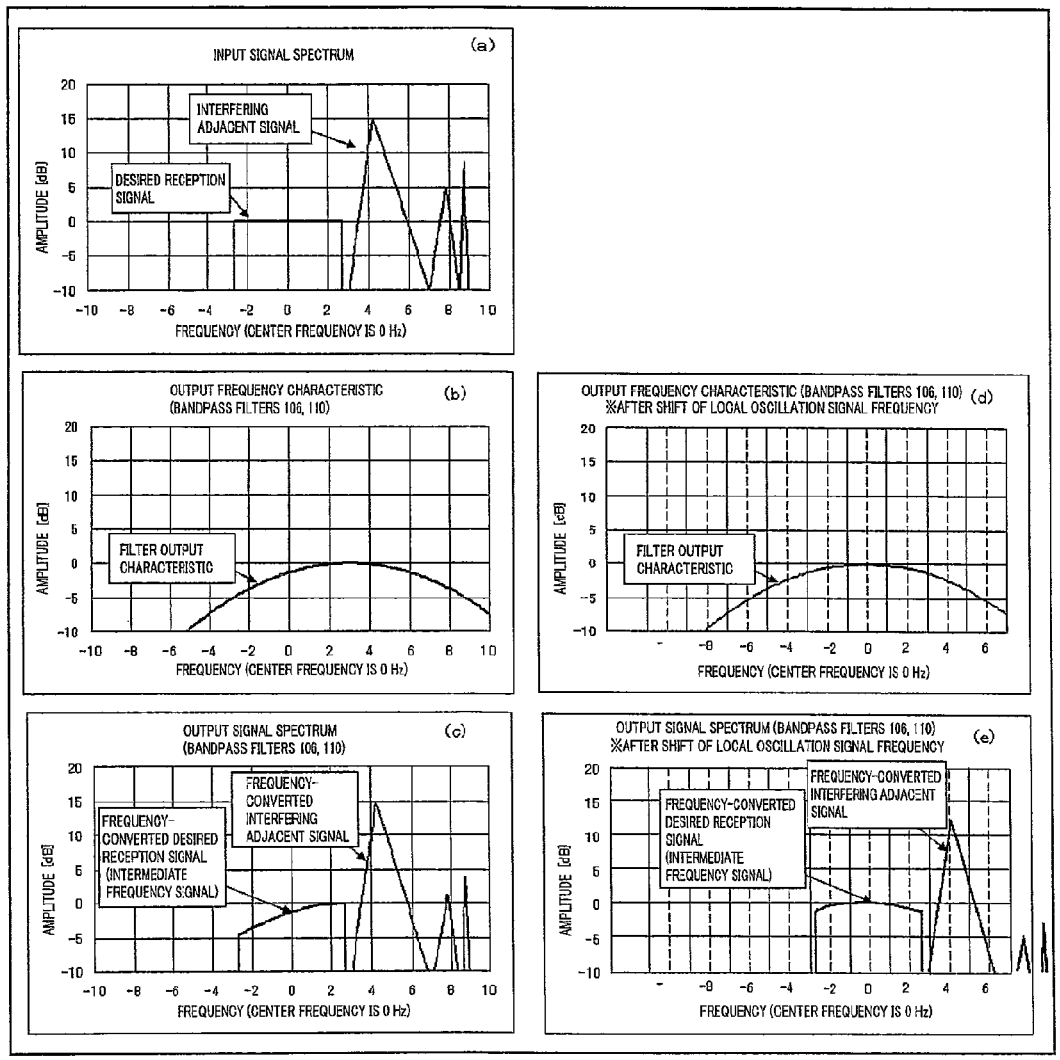
FIG. 3 illustrates a process of reducing an influence of an interfering adjacent signal in the first embodiment.

Next, FIG. 3 will be used to describe how the above-described optimum SN ratio setting changes an influence of an interfering adjacent signal that is a factor of SN ratio deterioration. In FIG. 3, the horizontal axis of each graph represents the frequency and, for input and output signals both, the center frequency is indicated as a reference (0 Hz). The vertical axis of each graph represents the amplitude of a signal that is indicated as a relative level with respect to a reference (0 dB) of an input signal level.

FIG. 3(a) shows an input signal spectrum when an interfering adjacent signal of an analog broadcast is present adjacent to a desired reception signal of a digital broadcast, and the broadcast signals are input to input terminal 101 of FIG. 1. FIG. 3(b) shows that filter 102 or filter 104 or both deviate by 3 MHz from a tuning frequency with which the center frequency of the intermediate frequency signal is obtained. FIG. 3(c) shows an output signal spectrum of intermediate frequency filters 106, 110 when the filter characteristic is the one shown in FIG. 3(b).

In this example, regarding the output signal spectrum, the desired reception signal is suppressed relative to the amplitude level at the center frequency, while the interfering adjacent signal is not suppressed, resulting in deterioration of the SN ratio. In FIG. 2, the SN ratio is 33 dB. Operation unit 114 of FIG. 1 causes storage unit 115 to temporarily store the SN ratio "33 dB" and the local oscillation frequency setting data which provides a shift amount of "0 Hz" of the center frequency of the intermediate frequency signal at this time.

After this, operation unit 114 changes the local oscillation frequency setting data in a stepwise manner, and causes storage unit 115 to successively update and store the SN ratio measurement value obtained for each local oscillation frequency setting data changed in the stepwise manner as shown in FIG. 2. Operation unit 114 sets, as optimum setting for the reception channel, "38 dB" in FIG. 2 which is the optimum SN ratio measurement value of those updated and stored successively in storage unit 115, and the oscillation frequency setting data from which the oscillation frequency "+2.8 MHz" at this time is obtained. As a result, in FIG. 3(d), the optimum SN ratio setting provides the center frequency of the intermediate frequency signal that is a frequency difference between the frequency at the peak of the output frequency characteristic of intermediate frequency filter 106 and the shifted local oscillation signal. As shown in FIG. 3(e), relative to the amplitude level at the center frequency, the desired reception signal is not suppressed while the interfering adjacent signal is suppressed.

As seen from the above, in order that the SN ratio of the reception channel under the influence of an interfering adjacent signal may have an optimum value, the local oscillation frequency is shifted to change the center frequency of the intermediate frequency signal of the reception channel and thereby lessen the influence of the interfering adjacent signal.

Second Embodiment

Next, a second embodiment of the present invention will be described with reference to FIGS. 4, 5, and 6. Regarding the first embodiment, in order that the SN ratio of the reception channel under the influence of an interfering adjacent signal may have an optimum value, the local oscillation frequency is shifted to change the center frequency of the intermediate frequency signal of the reception channel and thereby lessen the influence of the interfering adjacent signal. In the present embodiment, a tuning frequency of a bandpass filter for an intermediate frequency is shifted to lessen the influence of an interfering adjacent signal and provide optimum setting of the SN ratio of a reception channel.

Figure 4:
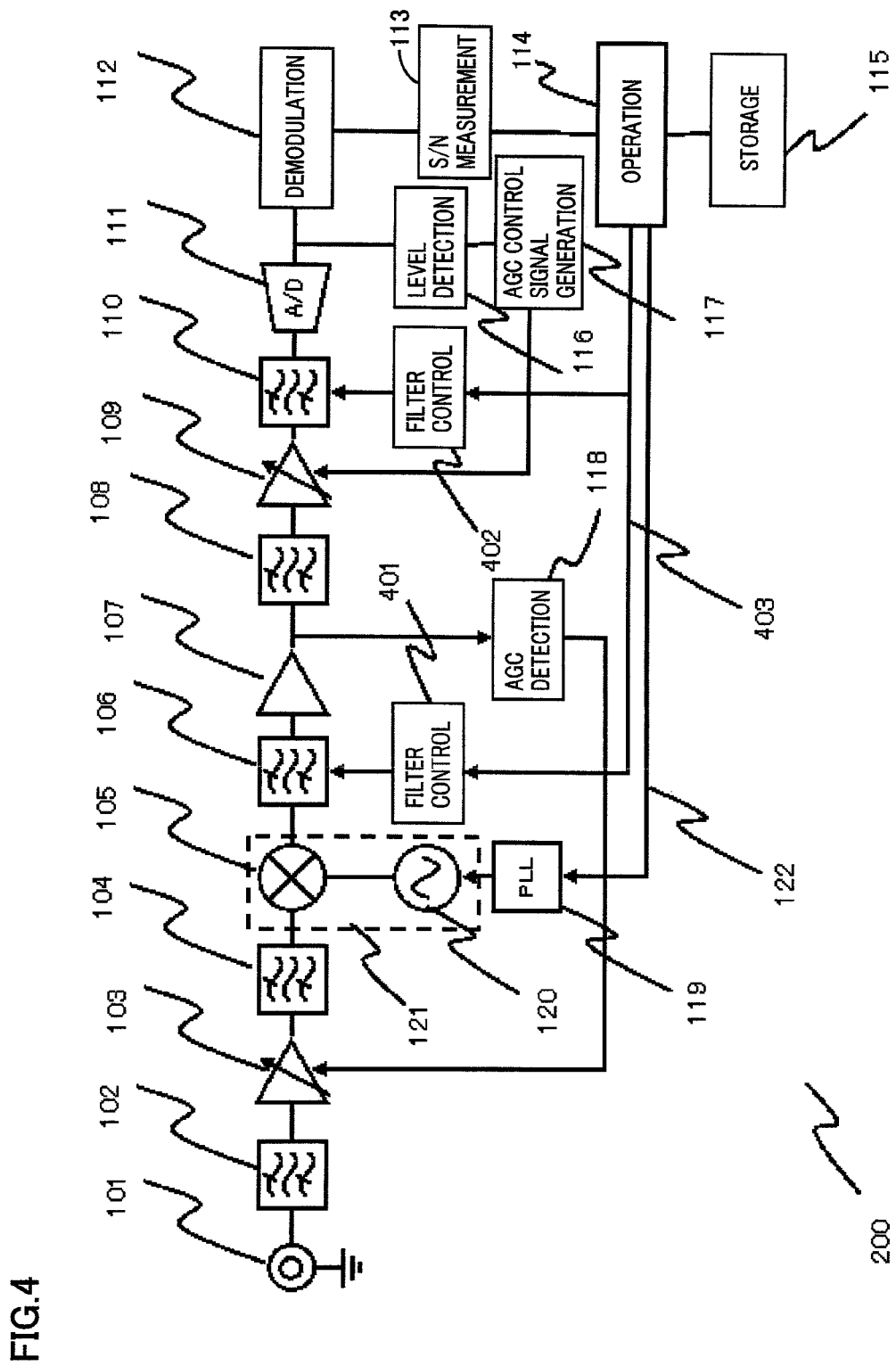
FIG. 4 is a block diagram showing a television broadcast receiving apparatus in a second embodiment.

A television broadcast receiving apparatus 200 shown in FIG. 4 includes filter control units 401, 402, in addition to the components of television broadcast receiving apparatus 100 of the first embodiment. In television broadcast receiving apparatus 200 of FIG. 4, in a similar manner to the first embodiment, a broadcast signal from a broadcast station is input to input terminal 101, passed through bandpass filter 102 allowing a frequency of a desired channel to pass, and amplified by variable gain amplifier 103 to an appropriate value. After this, the signal is passed again through bandpass filter 104 allowing only the frequency of the desired channel to pass, and input to mixer 105. Mixer 105 constitutes frequency conversion unit 121 together with local oscillator 120. The input signal to mixer 105 is mixed with an output signal of local oscillator 120 that is controlled by PLL unit 119 based on oscillation frequency setting data sent from operation unit 114 through bus 122, and is output as a sum and difference signal generated by mixing in the frequency range. Intermediate frequency filter 106, in which a tuning frequency is controlled by filter control unit 401 based on tuning frequency setting data provided from operation unit 114 through a bus 403, allows only a difference component of the output signal of mixer 105 to pass. The resultant output signal is an intermediate frequency signal that is first amplified by amplifier 107, and then input to SAW filter 108 and also detected by AGC detector 118. The resultant detection output signal controls the degree of amplification of variable gain amplifier 103. The signal with the frequency band limited by SAW filter 108 is appropriately amplified by variable gain amplifier 109, passed through bandpass filter 110, in which a tuning frequency is controlled by filter control unit 402 based on tuning frequency setting data provided from operation unit 114, and converted by A/D converter 111 to an input signal to demodulation unit 112. Level detector 116 detects the output signal of A/D converter 111. From the resultant detection output signal, a control signal is generated by AGC control signal generation unit 117, and by the control signal, variable gain amplifier 109 adjusts its degree of amplification so that the input level to demodulation unit 112 is made constant.

After the above-described operation, demodulation unit 112 demodulates the broadcast signal of the reception channel, and SN ratio measurement unit 113 outputs an SN ratio measurement value to operation unit 114. Operation unit 114 causes the input SN ratio measurement value and the tuning frequency setting data for filter control units 401, 402 with which this SN ratio measurement value is obtained, to be temporarily stored in storage unit 115. Storage unit 115 may be configured as shown in FIG. 4, or a register provided in operation unit 114 may be used.

FIG. 5 will be used next to describe shifting of the tuning frequency of intermediate frequency filters 106, 110, a relation between the shifting and an SN ratio measured for the shifted frequency, and an operation of performing, based on the result of the measurement, optimum SN ratio setting in a reception channel.

FIG. 5 shows how an SN ratio measurement value changes when the tuning frequency of the filter units is shifted with respect to 57 MHz for example. Examples of the SN ratio measurement value are shown for respective shifts of the tuning frequency of the filter units where a shift amount at the center is 0 Hz with respect to the center frequency of the intermediate frequency signal, and respective shift amounts in the + direction and the − direction each are 1 MHz, 2 MHz, and 2.8 MHz. The maximum value of the shift amount is +/−2.8 MHz to comply with an occupied frequency bandwidth of a reception channel. The spacing between the shift amounts may be set to any without being limited by what is specified above. Here, the occupied frequency bandwidth is the one as defined in connection with the first embodiment.

The description will now be given in connection with FIG. 4. Operation unit 114 sends the tuning frequency setting data to filter control units 401, 402, so that the tuning frequency of intermediate frequency filters 106, 110 shifts by an arbitrary spacing in a reception channel. The arbitrary spacing here is the shift amounts in the + direction and − direction as indicated above. Then, filter control units 401, 402 use the tuning frequency setting data from operation unit 114 to control the tuning frequency of intermediate frequency filters 106, 110 such that the frequency shifts by the arbitrary spacing as described above.

Thus, receiving apparatus 200 performs frequency conversion and demodulation with the shifted tuning frequency, and the SN ratio has a value at the time when the intermediate frequency signal is shifted by this arbitrary spacing. In the case where the SN ratio measurement value taken after the tuning frequency is shifted is better than the SN ratio measurement value stored in storage unit 115, operation unit 114 causes the stored value to be updated to the SN ratio measurement value after the tuning frequency is shifted, and the stored data to be updated to filter unit's tuning frequency setting data corresponding to the updated value. Then, after the above-described filter unit's tuning frequency shifting and temporary storage of the SN ratio measurement value are repeated within a shift range of the filter unit's tuning frequency (above-described +/−2.8 MHz), corresponding to the occupied frequency bandwidth of the reception channel, operation unit 114 transmits again to filter control units 401, 402 the filter unit's tuning frequency setting data providing the optimum SN ratio measurement value as filter unit's tuning frequency setting data providing the optimum SN ratio for the reception channel.

Namely, in the example of FIG. 5, the filter unit's tuning frequency setting data providing a filter unit's tuning frequency shift of −2.8 MHz with which an SN ratio measurement value of 38 dB is obtained is transmitted from operation unit 114 to filter control units 401, 402.

Next, referring to FIG. 6, a description will be given of how the above-described optimum SN ratio setting changes an influence of an interfering adjacent signal that is a factor of SN ratio deterioration.

Figure 6:
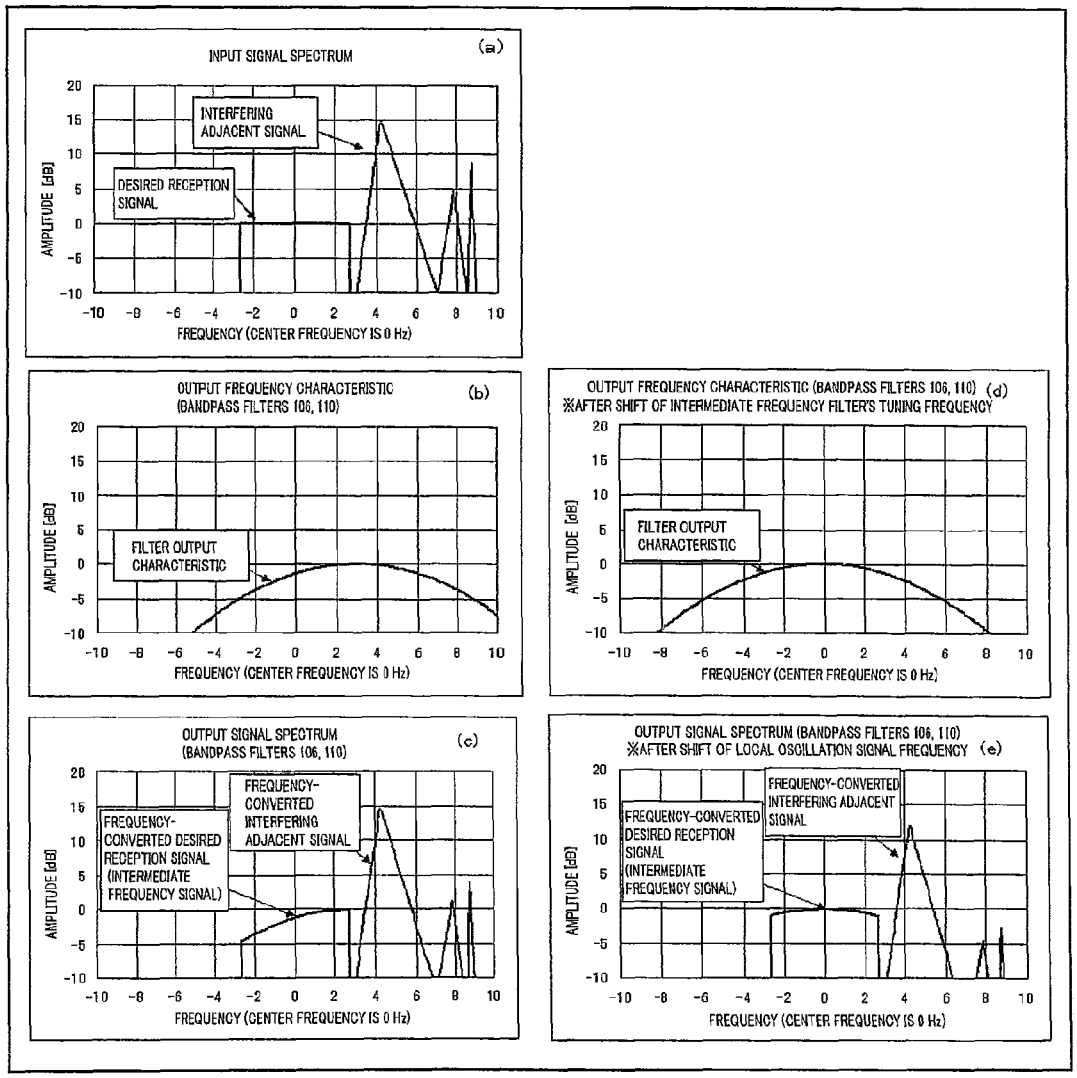
FIG. 6 illustrates a process of reducing an influence of an interfering adjacent signal in the second embodiment.

In FIG. 6, the horizontal axis of each graph represents the frequency and, for input and output signals both, relative to the center frequency indicated as a reference (0 Hz), frequencies higher and lower than the center frequency are plotted. The vertical axis of each graph represents the amplitude of a signal that is indicated as a relative level with respect to a reference (0 dB) of an input signal level.

FIG. 6(a) shows an input signal spectrum when an interfering adjacent signal of an analog broadcast is present adjacent to a desired reception signal of a digital broadcast, and the broadcast signals are input to input terminal 101 of FIG. 4. FIG. 6(b) shows that filter 102 or filter 104 or both deviate by 3 MHz from a tuning frequency with which the center frequency of the intermediate frequency signal is obtained. FIG. 6(c) shows an output signal spectrum of intermediate frequency filters 106, 110 when the filter characteristic is the one shown in FIG. 6(b). In this example, regarding the output signal spectrum, the desired reception signal is suppressed relative to the amplitude level at the center frequency, while the interfering adjacent signal is not suppressed, resulting in deterioration of the SN ratio. In FIG. 5, the SN ratio is 33 dB. Operation unit 114 of FIG. 4 causes storage unit 115 to temporarily store the SN ratio "33 dB" and the tuning frequency setting data which provides a shift amount of "0 Hz" of the tuning frequency at this time.

After this, operation unit 114 changes the filter unit's tuning frequency setting data in a stepwise manner, and causes storage unit 115 to successively update and store the SN ratio measurement value obtained for each filter's tuning frequency setting data changed in a stepwise manner as shown in FIG. 5. Operation unit 114 sets, as optimum setting for the reception channel, "38 dB" in FIG. 5 which is the optimum SN ratio measurement value of those updated and stored successively in storage unit 115, and the filter unit's tuning frequency setting data from which the oscillation frequency "−2.8 MHz" at this time is obtained. As a result, in FIG. 6(d), the optimum SN ratio setting provides the peak point of the output frequency characteristic of intermediate frequency filters 106, 110 that is substantially equal to the center frequency of the intermediate frequency signal. As shown in FIG. 6(e), with respect to the amplitude level at the center frequency, the desired reception signal is not suppressed and rather the interfering adjacent signal is suppressed.

As seen from the above, in order that the SN ratio of the reception channel under the influence of an interfering adjacent signal may have an optimum value, the tuning frequency of the intermediate frequency filters is shifted to change the intermediate frequency signal output characteristic for the reception channel and thereby lessen the influence of the interfering adjacent signal.

Third Embodiment

In connection with the foregoing embodiments, respective examples have been described in which the oscillation frequency of the local oscillation signal is shifted and the tuning frequency of the intermediate frequency filters is shifted to achieve optimum setting of the SN ratio. In some cases, however, as the shift amount of the frequency is increased, normal demodulation cannot be maintained. A reason for this is that, when the input signal to the demodulation unit has an extremely unfavorable characteristic, the demodulation process cannot be performed. Such normal demodulation and abnormal demodulation are referred to as demodulation lock state and demodulation unlock state, respectively.

Here, the demodulation lock state refers to a state where signal processing by a carrier recovery unit (not shown) or a timing recovery unit (not shown) constituting the demodulation unit is normally carried out.

More specifically, the carrier recovery unit chiefly performs a carrier (carrier wave) recovery process for a base band signal, and the timing recovery unit chiefly performs a symbol clock recovery process for digital demodulation. Generally, these processes employ a loop configuration, and therefore, a normal demodulation state is called demodulation lock state, while a state where normal demodulation is impossible due to for example the fact that a characteristic-deteriorated signal is input is called demodulation unlock state.

Here, when the setting causes the demodulation unlock state, the receiving apparatus cannot be used. In some cases, however, the setting providing an optimum SN ratio could be close to the setting by which the demodulation lock cannot be maintained. More specifically, even if the setting provides an optimum SN ratio, a change in the ambient temperature of a receiver (not shown) for example that occurs after the optimum setting may cause the local oscillator or filter unit to suffer from frequency drift or amplitude drift, resulting in the demodulation unit shifted to a state in which the demodulation lock cannot be maintained, or completely shifted to the demodulation unlock state.

In view of this, according to the present embodiment, a demodulation lock detection unit is provided between the demodulation unit and the SN ratio measurement unit, and the operation unit determines, based on the result of detection by the demodulation lock detection unit, the transition probability from the demodulation lock state to the demodulation unlock state, for each optimum SN ratio setting by means of shifting of the frequency of the local oscillation signal, or shifting of the tuning frequency of the intermediate frequency filter. A setting that causes a high transition probability is not used, even if the setting provides a good SN ratio. Rather, such a setting that provides an optimum SN ratio is determined, from those settings causing low transition probabilities to the demodulation unlock state. This setting is used as an optimum setting.

Figure 7:
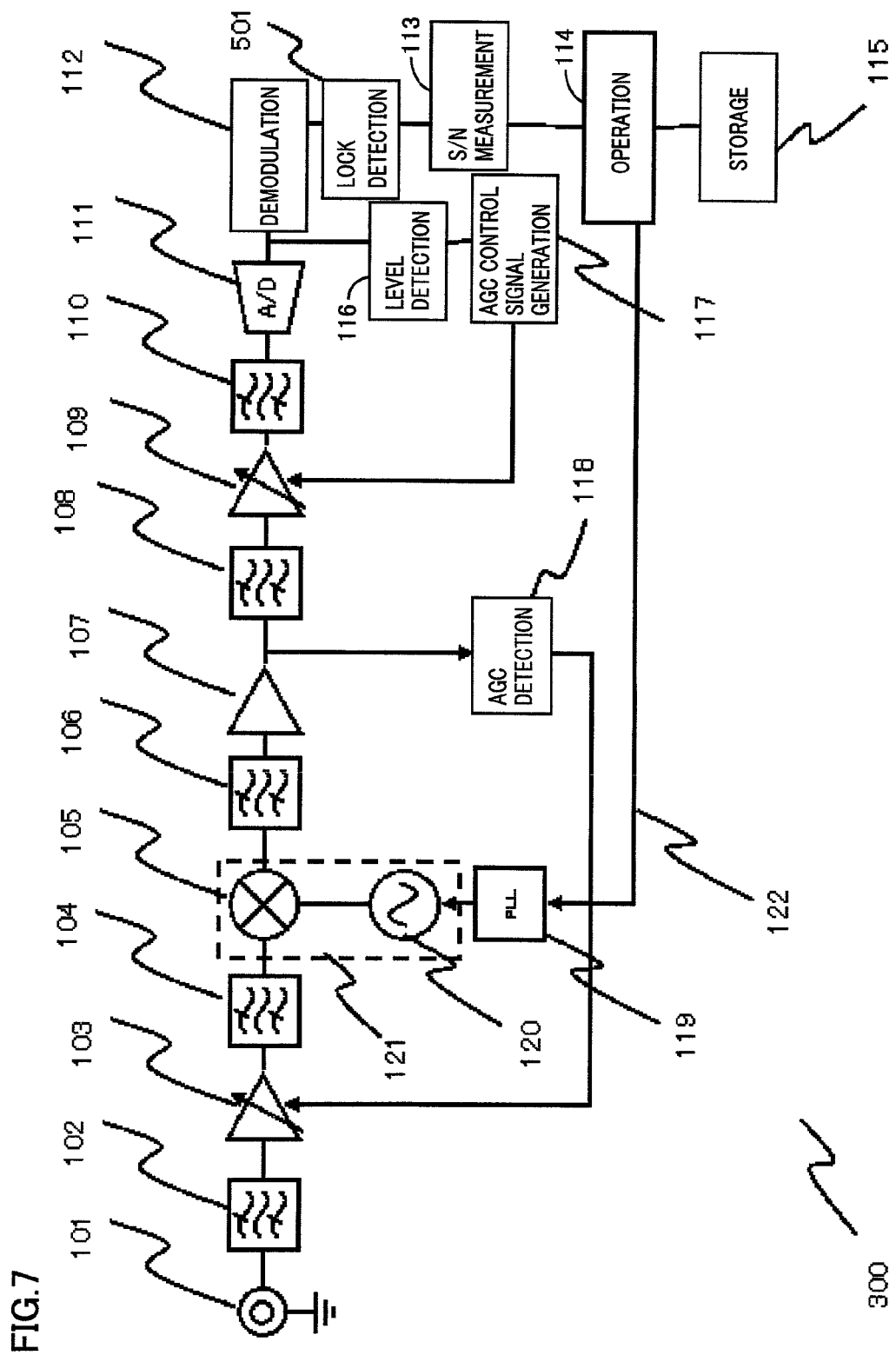
FIG. 7 is a block diagram showing a television broadcast receiving apparatus in a third embodiment.
Figure 8:
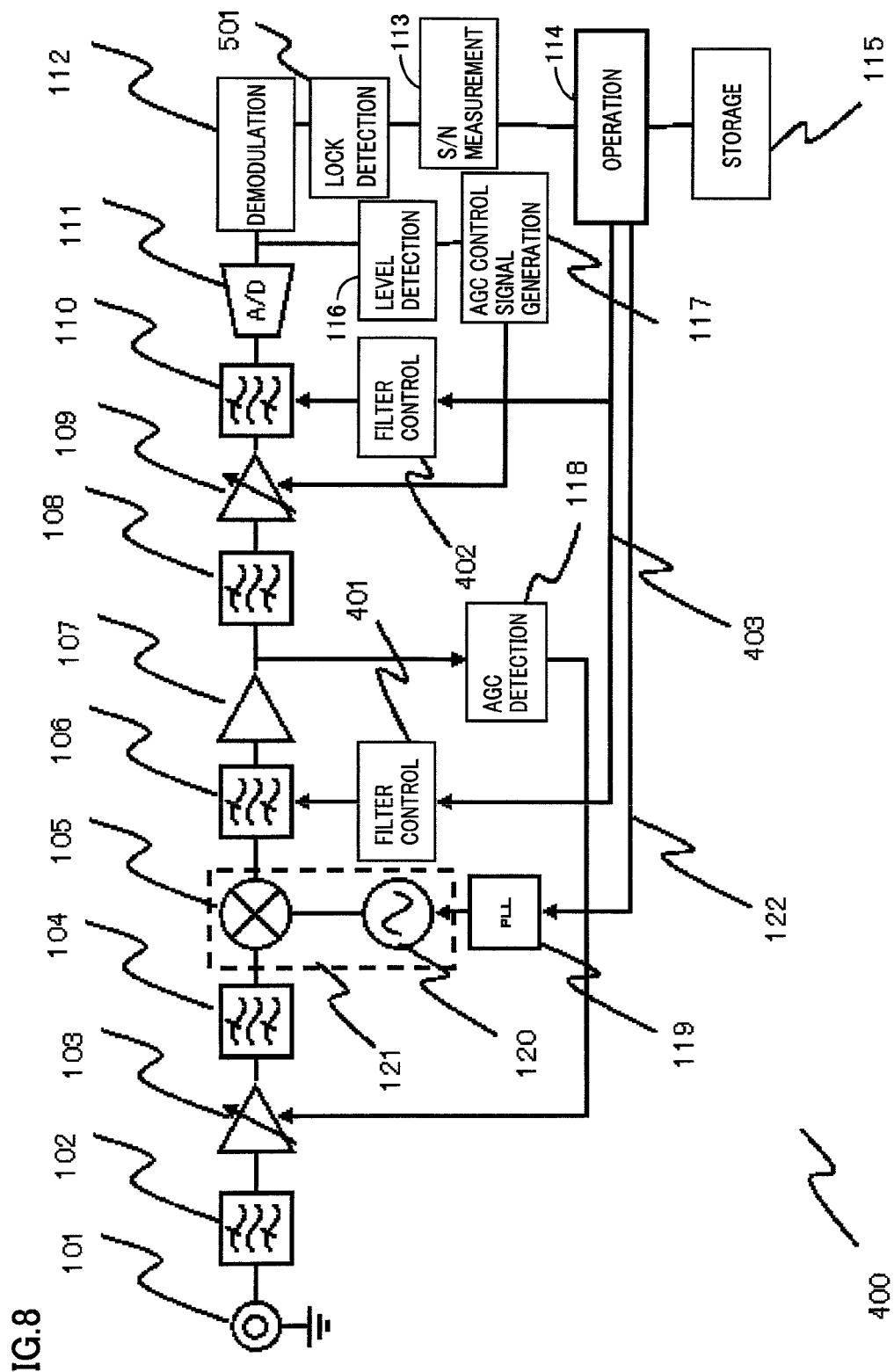
FIG. 8 is another block diagram showing a television broadcast receiving apparatus in the third embodiment.
Figure 9:
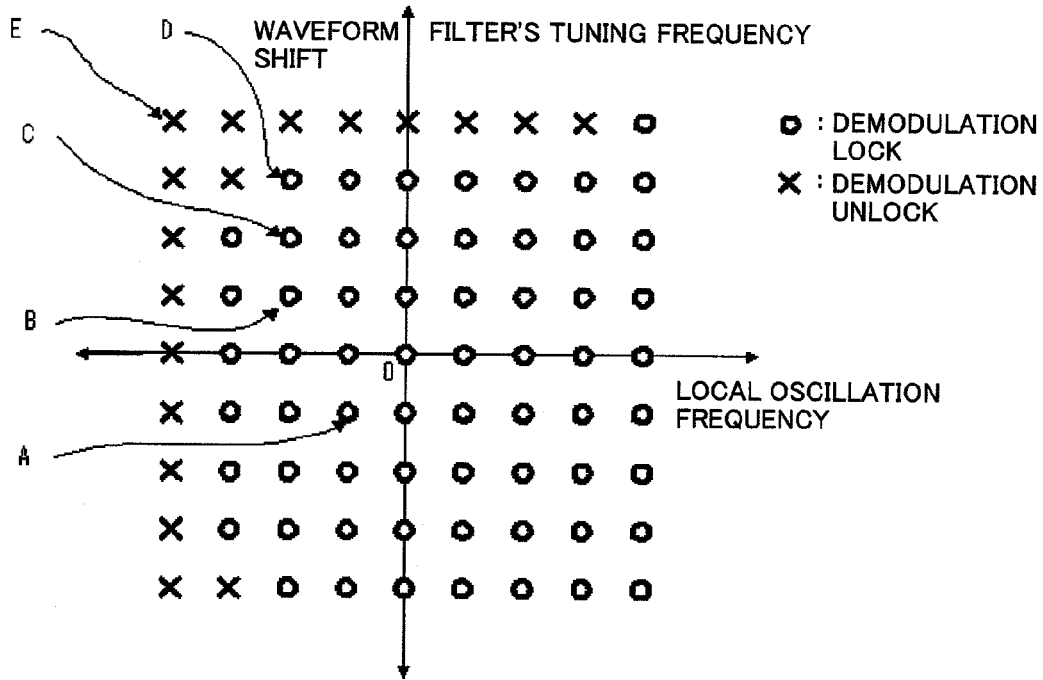
FIG. 9 illustrates how a demodulation lock transition probability is determined in the third embodiment.

A specific example of this optimum setting will be described with reference to FIGS. 7, 8 and 9. FIGS. 7 and 8 show respective configurations in which a lock detection unit 501 is provided between demodulation unit 112 and SN ratio measurement unit 113, relative to respective configurations of the first embodiment (FIG. 1) and the second embodiment (FIG. 4). In FIG. 9, the horizontal axis represents a shift amount of the frequency of the local oscillation signal, and the vertical axis represents a shift amount of the tuning frequency of the intermediate frequency filter, each shift amount is shifted by four steps at the maximum in the + or − direction relative to the center frequency (the origin in FIG. 9) of the intermediate frequency signal, and the demodulation lock or unlock state for each shift is plotted. In FIG. 9, the O mark represents the demodulation lock state and the X mark represents the demodulation unlock state.

Referring to FIG. 9, it is supposed that, with respect to a position corresponding to a certain shift amount setting, the upper, lower, right, and left adjacent positions include a position indicated by the X mark representing a setting resulting in the demodulation unlock state. In this case, the transition probability from the demodulation lock state to the demodulation unlock state of the certain shift amount setting at the position is represented by 1. Further, with respect to the position corresponding to the certain shift amount setting, when the obliquely adjacent positions include a position indicated by the X mark representing a setting resulting in the demodulation unlock state, the transition probability of the certain shift amount setting is represented by 0.5. The transition probability of a certain setting at a position is evaluated based on the sum of all transition probabilities with respect to the upper, lower, right, left, and obliquely adjacent positions, respectively. Regarding the evaluation of the transition probability of points A to D in FIG. 9, points A and B are not adjacent to positions of the demodulation unlock state, and therefore, respective transition probabilities of points A and B are 0. As to point C, the upper-left obliquely adjacent point represents the demodulation unlock state, and therefore, the transition probability is 0.5. As to point D, the left and upper adjacent positions and the upper-left and upper-right obliquely adjacent positions represent the demodulation unlock state, and therefore, the transition probability is 3.5. The setting at point E representing the demodulation unlock state cannot be used.

In this way, the transition probability is determined as described in connection with the example above for each of local oscillation frequency settings and intermediate-frequency-filter's tuning frequency settings to provide the demodulation lock state and, from settings of respective transition probabilities falling within a determination reference value (less than 1 for example), a setting providing an optimum SN ratio is selected.

In the present embodiment, respective values of the transition probability with respect to the upper, lower, right, and left positions are defined as the same value of 1, and those with respect to the obliquely adjacent positions are also defined as the same value of 0.5. Instead, the transition probabilities with respect to these positions may have different values. Further, in the present embodiment, as to a point located at a position corresponding to a certain shift amount setting and located adjacent to no positions representing the demodulation unlock state, the point is defined as having the transition probability of 0. Instead, for example, with respect to all points representing the demodulation unlock, values of shift amounts may be compared between point A and point B, and it may be determined in such a manner that the transition probability of point A is higher than that of point B.

Furthermore, the present embodiment illustrates an example where frequency shifting of the local oscillation signal and the tuning frequency shifting of the intermediate frequency filter are both carried out. The transition probability can also be determined when one of these frequencies is shifted. The shift amount is not limited to four steps, and may be set freely.

Thus, the transition probability from the demodulation lock to the demodulation unlock is determined, and then which of the setting values of low transition probability provides an optimum SN ratio is determined. In this way, reception with a safe and good-performance setting value is possible.

Fourth Embodiment

Figure 10:
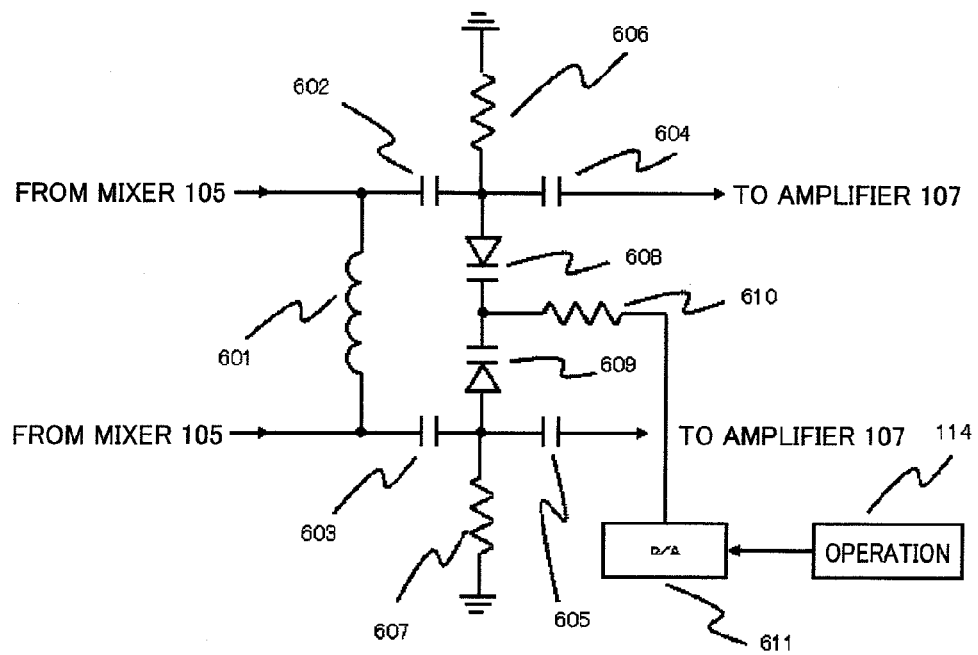
FIG. 10 is a circuit diagram showing a filter unit in a fourth embodiment.

Next, a fourth embodiment will be described for a specific configuration of the intermediate frequency filter of the present invention, with reference to FIG. 10. FIG. 10 shows an exemplary configuration of intermediate frequency filters 106, 110 in the configurations of the second embodiment (FIG. 4) and the third embodiment (FIG. 8). The configuration and operation from the output end of mixer 105 to the input end of amplifier 107 in FIGS. 4 and 8 will be described with reference to FIG. 10.

An inductor 601 and variable capacity diodes 608, 609 constitute a main part of the filter circuit. Capacitors 602, 603, 604, 605 are provided for blocking direct current, and resistors 606, 607 are provided for allowing the anodes of variable capacity diodes 608, 609 to have a ground potential. A resistor 610 is provided for applying a DC voltage to variable capacity diodes 608, 609. A D/A conversion unit 611 (corresponding to filter control units 401, 402 in FIGS. 4 and 8) converts a binary signal that is tuning frequency setting data from operation unit 114, to said DC voltage. Here, the configuration of the bandpass filter may be any other than the configuration shown in FIG. 10, as long as an inductor and variable capacity diodes are combined and a certain characteristic is obtained. Further, intermediate frequency filters 106, 110 may have the same circuit configuration, or have different circuit configurations.

In the above-described configuration, the intermediate frequency signal that is an output signal of mixer 105 is limited in the pass frequency band by the filter circuit and transmitted to amplifier 107 of the subsequent stage. The tuning frequency changes in response to the condition that respective cathodes of variable capacity diodes 608, 609 are connected and a DC voltage is applied through resistor 610 to the connection point of the cathodes to change the terminal-to-terminal capacity. Regarding the variable capacity diodes, the terminal-to-terminal capacity changes substantially linearly relative to the applied DC voltage. Therefore, in the present embodiment, the tuning frequency can be finely and successively changed and also can be changed in a wide range, and precise setting for an optimum SN ratio of a reception channel can be performed.

Fifth Embodiment

Figure 11:
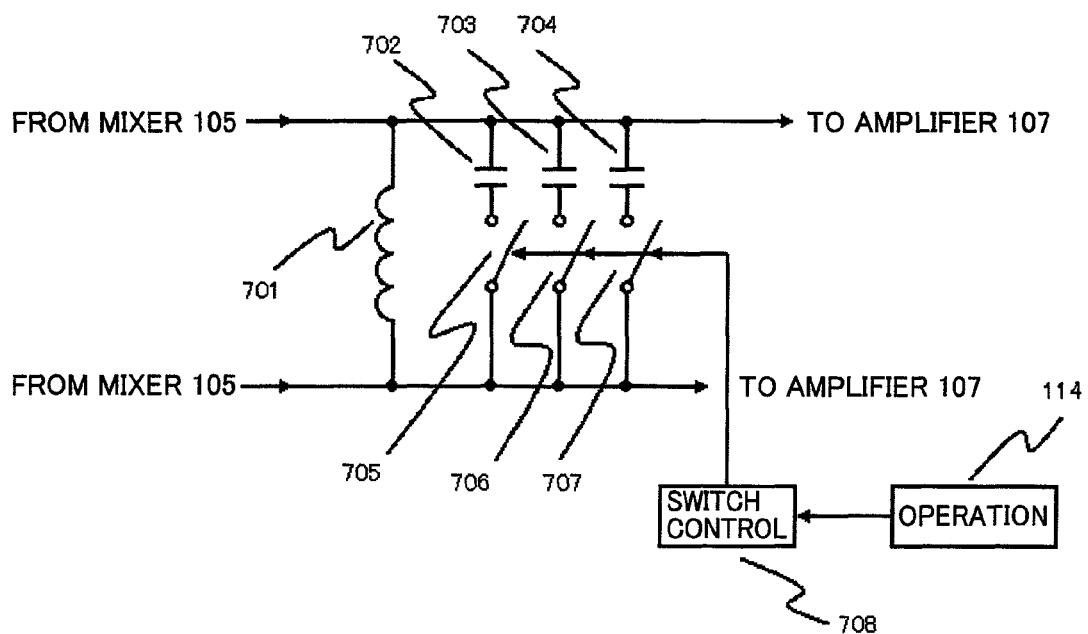
FIG. 11 is a circuit diagram showing a filter unit in a fifth embodiment.

Next, a fifth embodiment will be described for a specific configuration of the intermediate frequency filter of the present invention, with reference to FIG. 11. FIG. 11 shows another configuration of intermediate frequency filters 106, 110 in the configurations of the second embodiment (FIG. 4) and the third embodiment (FIG. 8). The configuration and operation from the output end of mixer 105 to the input end of amplifier 107 in FIGS. 4 and 8 will be described with reference to FIG. 11.

A combination of an inductor 701 and capacitors 702 to 704 constitutes a main part of a tuning circuit. Capacitors 702 to 704 each have one end connected to one end of inductor 701, and the other end connected to a corresponding one end of switches 705 to 707. The other ends of switches 705 to 707 are connected to the other end of inductors 701. A switch control unit 708 is arranged for controlling opening and closing of switches 705 to 707, and controls opening and closing of switches 705 to 707 based on a binary signal that is tuning frequency setting data from operation unit 114. Here, in the example of FIG. 11, the number of capacitors and the number of switches are each three, the number may be set depending on a shift spacing and a shift amount of the tuning frequency.

In the above-described configuration, the intermediate frequency signal that is an output signal of mixer 105 is limited in the frequency band by the tuning circuit and transmitted to amplifier 107 of the subsequent stage. The tuning frequency changes depending on a combination of connecting or disconnecting capacitors 702 to 704 to or from inductor 701. At this time, respective capacitance values of capacitors 702 to 704 may be all identical to each other or all different from each other. For example, in the case where a shift setting value of the tuning frequency can be predicted from the trend in advance, respective capacitance values of capacitors 702 and 703 may be set small and the capacitance value of capacitor 704 may be set larger or smaller relative to capacitors 702, 703, and accordingly, the tuning frequency can be set depending on a predicted shift spacing or shift amount.

Sixth Embodiment

Figure 12:
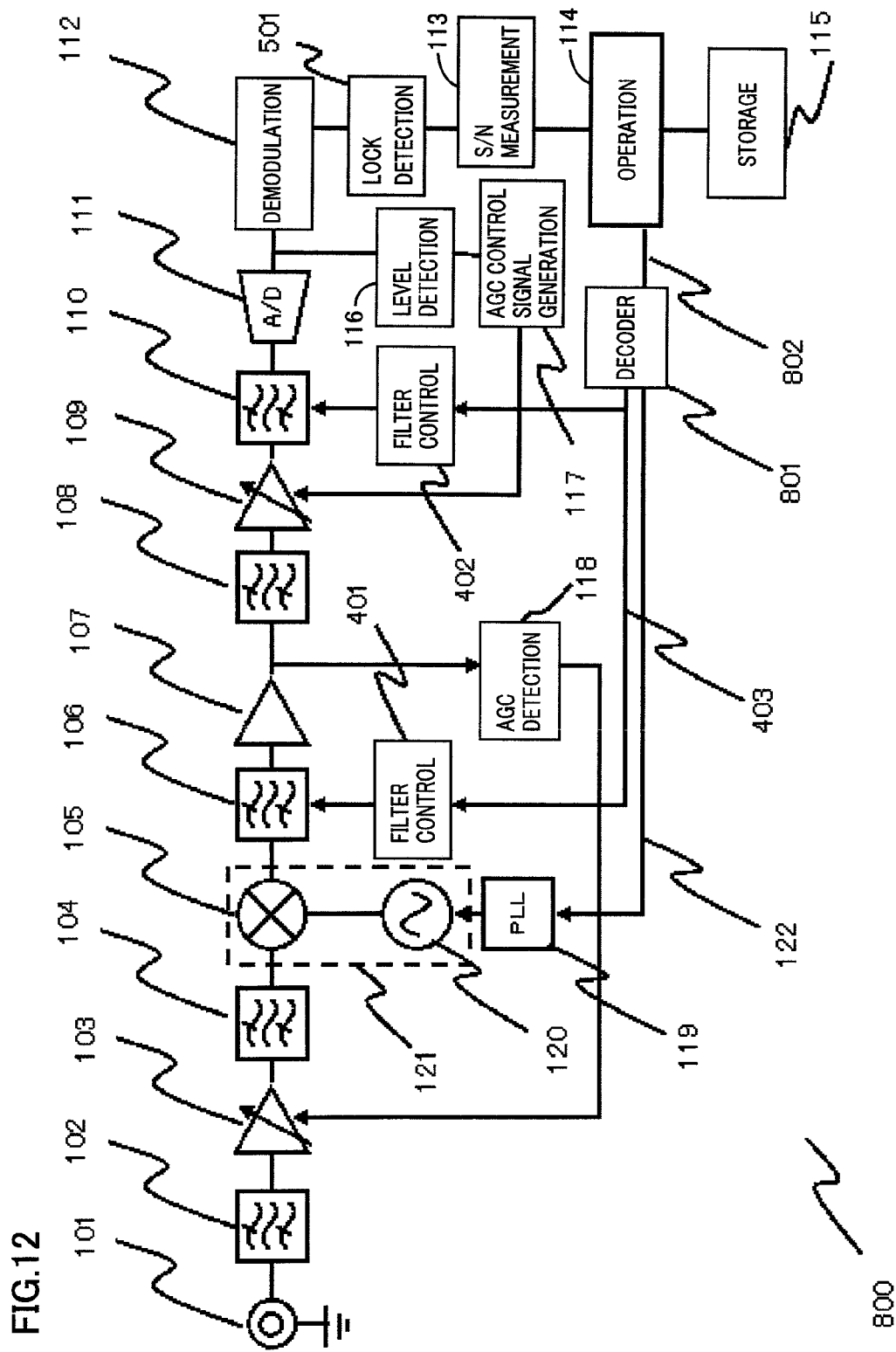
FIG. 12 is a block diagram showing a television broadcast receiving apparatus in a sixth embodiment.

Next, a sixth embodiment of the present invention will be described with reference to FIGS. 11, 12, and 13. FIG. 12 is a block diagram showing the present embodiment. FIG. 12 differs from the second embodiment (FIG. 4) in that a single bus 802 extends from operation unit 114 toward PLL unit 119 and filter control units 401, 402, and a decoder 801 is provided between bus 802 and PLL unit 119 and filter control units 401, 402.

Figure 13:
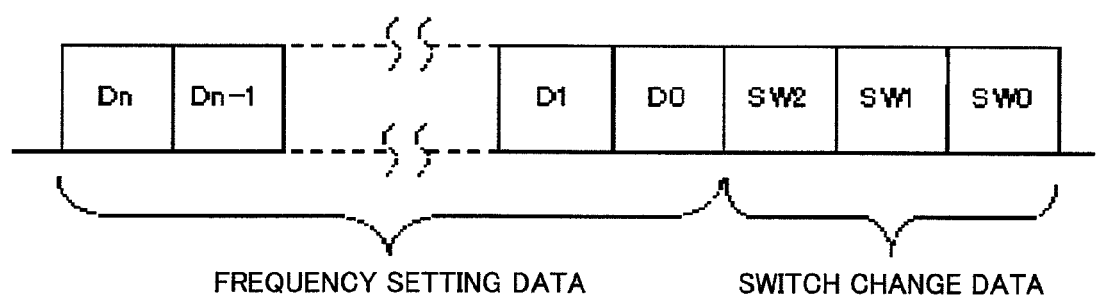
FIG. 13 shows exemplary setting data in the sixth embodiment.

As the data transmitted from operation unit 114, synthetic data constituted of frequency setting data and switch change data as shown by exemplary data of FIG. 13 is output. This data is input to decoder 801 through single bus 802. This synthetic data is separated by decoder 801 into frequency setting data D0 to Dn and switch change data SW0 to SW2. In the example of FIG. 13, the data of D0 bit to Dn bit of the frequency setting data is transmitted to PLL unit 119 and the frequency is set based on the data. Switch change data SW0 to SW2 is transmitted to filter control units 401, 402 (switch control unit 708 in FIG. 11), as switch change data SW2, SW1, SW0 corresponding to switches 705, 706, 707 in FIG. 11, for controlling opening and closing of switches 705, 706, 707 in FIG. 11.

Thus, the frequency setting data and the switch change data are transmitted by one bus from operation unit 114, and accordingly the number of control buses can be reduced and an operation unit with a smaller number of I/O ports can be selected. Further, the extension of the bus from the operation unit to the PLL unit and the filter control units is reduced and the influence of the ambient noise entering the PLL unit and the filter control units through the bus can be minimized, and accordingly the control precision of each control unit can be enhanced. Furthermore, since the local oscillation frequency control and the filter characteristic change control can be performed simultaneously, the control system of high efficiency can be constructed.

Seventh Embodiment

Figure 14:
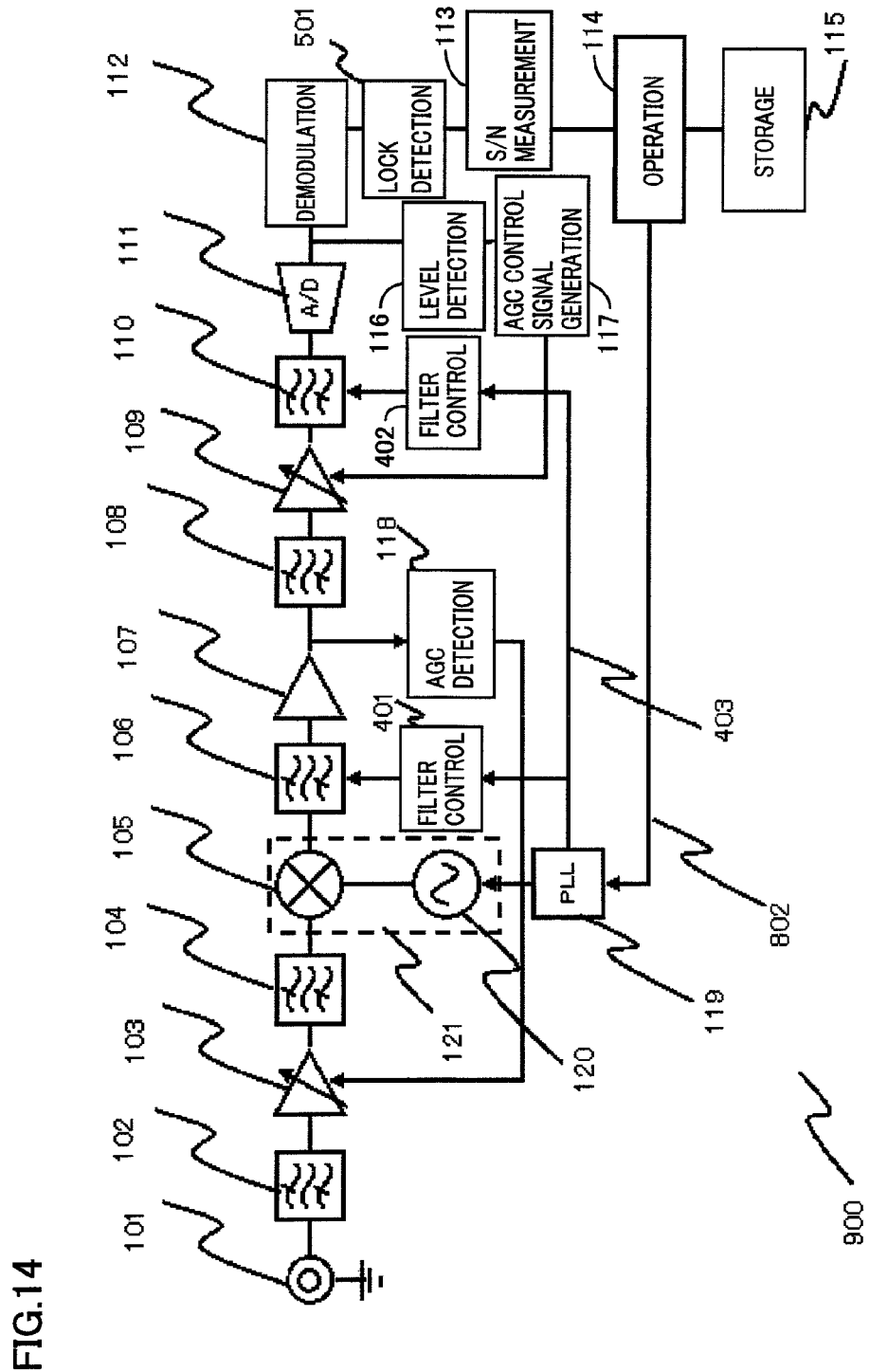
FIG. 14 is a block diagram showing a television broadcast receiving apparatus in a seventh embodiment.

Next, a seventh embodiment of the present invention will be described with reference to FIGS. 11, 12, 13, and 14. FIG. 14 differs from the sixth embodiment (FIG. 12) in that filter control units 401, 402 are controlled through PLL unit 119. In the case of the present embodiment, synthetic data of frequency setting data and switch change data is transmitted through bus 802 to PLL unit 119, and the synthetic data is separated in PLL unit 119 into frequency setting data and filter characteristic change data. Here, the synthetic data may be the one having a similar data format to that of FIG. 13 used in the sixth embodiment. After this, the separated data is transmitted from the output port of PLL unit 119 through bus 403 to filter control units 401, 402.

Thus, one bus extending from operation unit 114 is used to transmit the frequency setting data and the switch change data. Accordingly the number of control buses can be reduced and an operation unit having a smaller number of I/O ports can be selected. Further, since extension of the bus from the operation unit to the PLL unit and the filter control units can be minimized, the influence of the ambient noise entering the control units through the bus can be minimized, and accordingly the control precision of each control unit can be enhanced. Furthermore, in this example, filter units 401, 402 are controlled through PLL unit 119, and therefore, additional components are unnecessary and switching of the filter control units can be changed at low cost.

Eighth Embodiment

Figure 15:
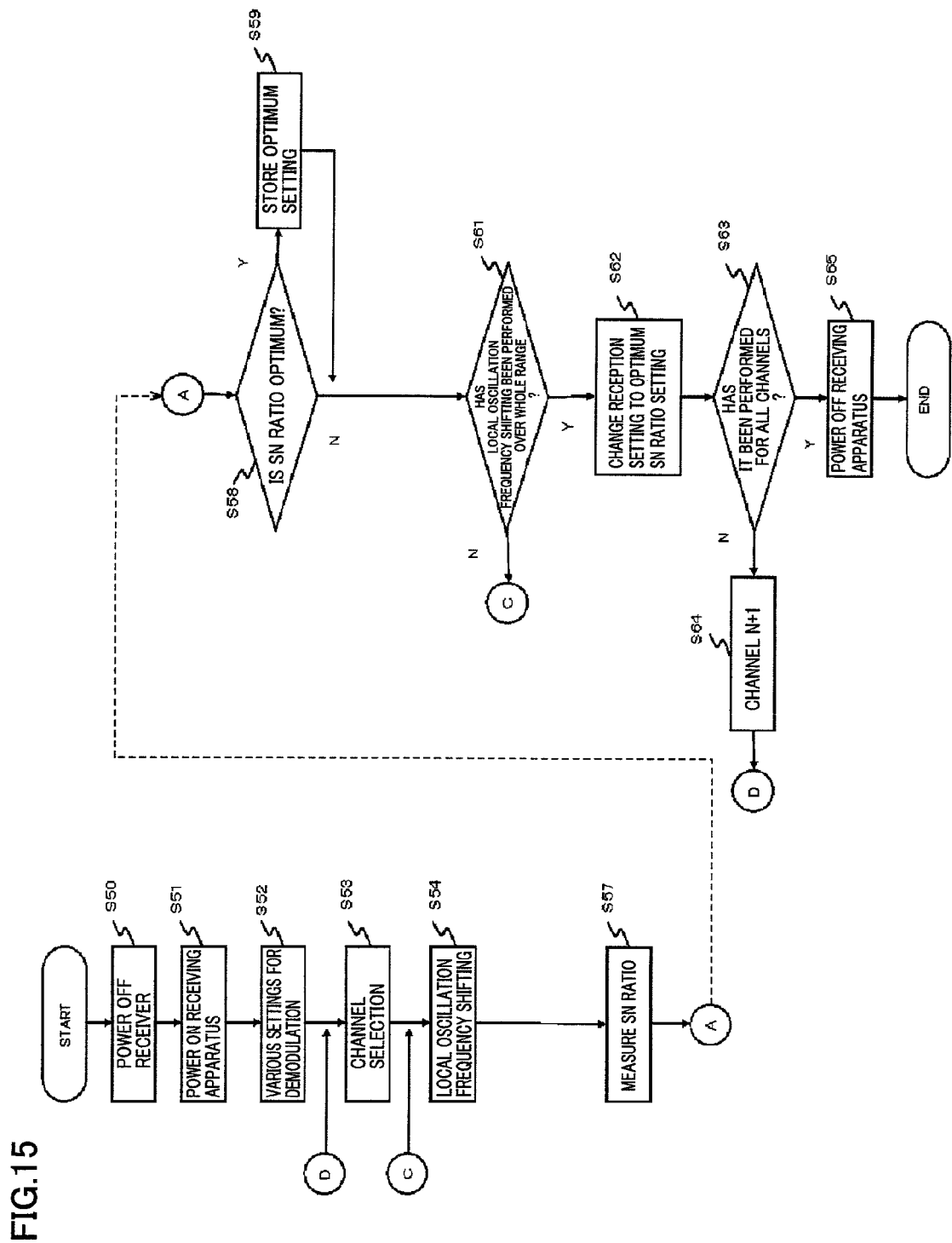
FIGS. 15 to 18 are flowcharts illustrating an exemplary optimum SN ratio setting in eighth to eleventh embodiments respectively.

A method of setting the SN ratio to an optimum value by frequency shifting of the local oscillation signal in a reception channel will be described with reference to FIGS. 1 and 15. FIG. 15 is a flowchart illustrating setting of the SN ratio to an optimum ratio in the present embodiment.

It is supposed that, in receiving apparatus 100, auto-search is used to search for watchable channels, respective SN ratios for all watchable channels are thereafter measured, and the measurement values are stored in storage unit 115. At this time, for local oscillator 120, the above-described auto-search is performed with an oscillation frequency with which the center frequency of the intermediate frequency signal is obtained, and the setting of the oscillation frequency at this time is also stored in storage unit 115 together with the SN ratio measurement value. Intermediate frequency filters 106 and 110 are fixed at a preset tuning frequency.

After a receiver (not shown) is powered off (S50), receiving apparatus 100 is still kept powered (S51). Then, various settings for demodulation and measurement of the SN ratio for example are performed (S52). Then, from all watchable channels, an arbitrary channel N is selected (S53). Then, for the selected channel, oscillation frequency shifting of local oscillator 120 is performed. For example, the oscillation frequency is shifted higher or lower by an interval of 142.86 kHz (S54). Then, the SN ratio at the time when frequency conversion and demodulation are performed with the shifted local oscillation frequency is measured (S57). It is determined whether the SN ratio measured after the local oscillation frequency is shifted is better than the measurement value of the SN ratio stored in storage unit 115 (S58). When the SN ratio after the local oscillation frequency is shifted is better, the stored SN ratio measurement value is updated to the SN ratio measurement value that corresponds to the shift amount at this time and stored as an optimum SN ratio setting value for the arbitrary channel N (S59). After this, it is determined whether the oscillation frequency shifting of local oscillator 120 has been performed over the whole shift range (S61). If not, the process returns to step S54 in which shifting of the local oscillation frequency is performed. When it is determined in step S61 that shifting of the local oscillation frequency has been performed over the whole shift range, the value stored in step S59 is updated as the optimum SN ratio setting value (S62). It is determined whether the optimum SN ratio setting has been performed for all watchable channels (S63). If not, selection of an arbitrary channel N+1 is designated (S64), and the process returns to step S53 in which channel selection is performed. When it is determined that the optimum SN ratio setting has been performed for all watchable channels, receiving apparatus 100 is powered off (S65). For the next watching, the local oscillation frequency is set to the one providing the optimum SN ratio measurement value that is set in step S62 for arbitrary channel N.

In this way, when the receiver is powered off, the local oscillation frequency is adjusted for an arbitrary reception channel so that the local oscillation frequency is appropriate for the reception environment such as a change in influence of an adjacent channel, and accordingly favorable reception characteristics are obtained all the time when watching is resumed.

Ninth Embodiment

Figure 16:
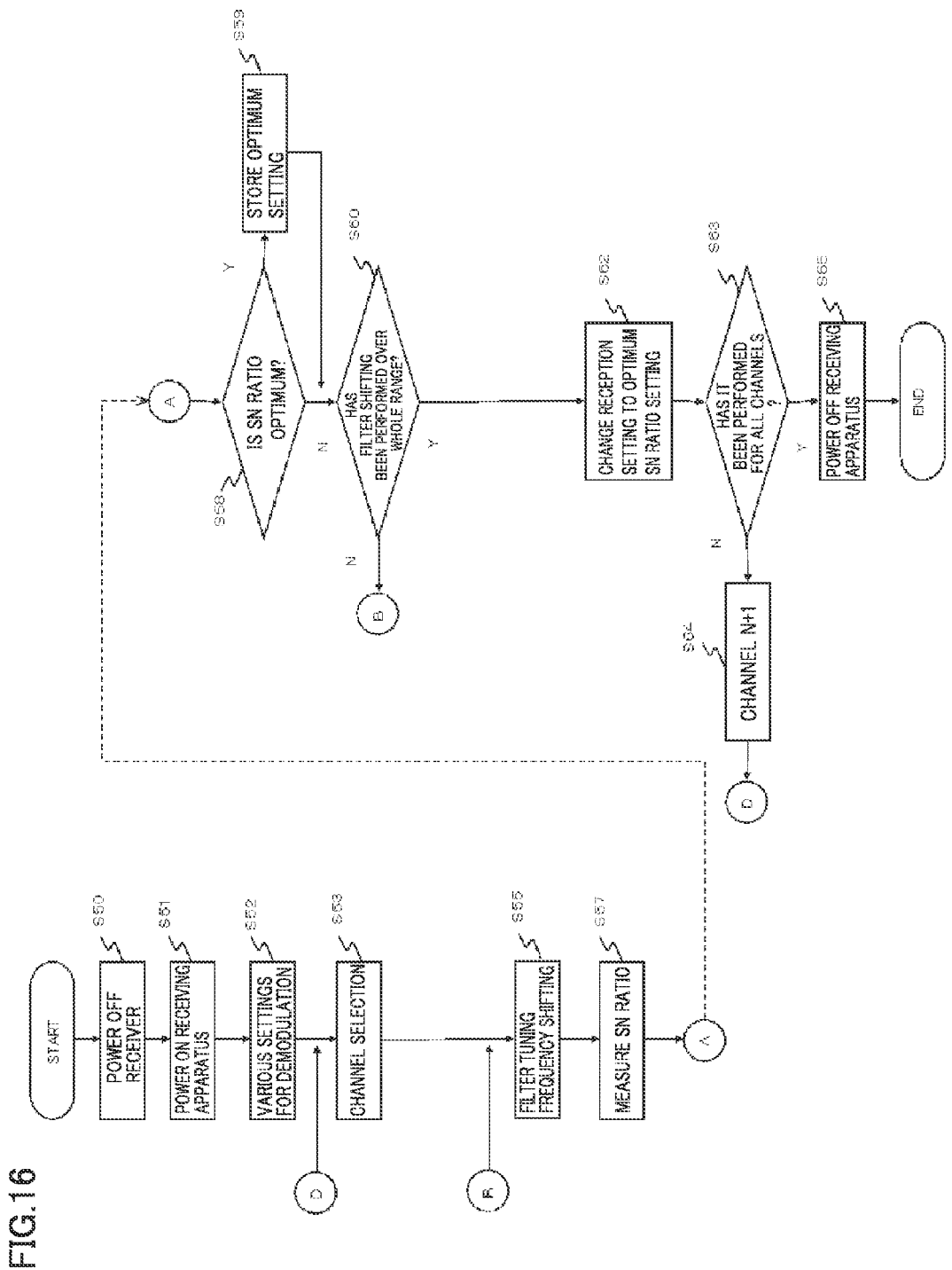

A method of setting the SN ratio to an optimum value by shifting of the tuning frequency of the intermediate frequency filter in a reception channel will be described with reference to FIGS. 4 and 16. FIG. 16 is a flowchart illustrating setting of the SN ratio to an optimum ratio in the present embodiment.

It is supposed that, in receiving apparatus 200, auto-search is used to search for watchable channels, respective SN ratios for all watchable channels are thereafter measured, and the measurement values are stored in storage unit 115. At this time, for local oscillator 120, the above-described auto-search is performed with an oscillation frequency with which the center frequency of the intermediate frequency signal is obtained.

After a receiver (not shown) is powered off (S50), receiving apparatus 200 is still kept powered (S51). Then, various settings for demodulation and measurement of the SN ratio for example are performed (S52). Then, from all watchable channels, an arbitrary channel N is selected (S53). Then, for the selected channel, tuning frequency shifting of intermediate frequency filters 106, 110 is performed. For example, the tuning frequency is shifted higher or lower by an interval of 100 kHz (S55). Then, the SN ratio at the time when frequency conversion and demodulation are performed with the shifted tuning frequency is measured (S57). It is determined whether the SN ratio measured after the tuning frequency of the intermediate frequency filter is shifted is better than the measurement value of the SN ratio stored in storage unit 115 (S58). When the SN ratio after the intermediate-frequency-filter's tuning frequency is shifted is better, the stored SN ratio measurement value is updated to the SN ratio measurement value that corresponds to the shift amount at this time and stored as an optimum SN ratio setting value for the arbitrary channel N (S59). After this, it is determined whether the tuning frequency shifting of intermediate frequency filters 106, 110 has been performed over the whole shift range (S60). If not, the process returns to step S55 in which tuning frequency shifting is performed. When it is determined in step S60 that shifting of the intermediate-frequency-filter's tuning frequency has been performed over the whole shift range, the value stored in step S59 is updated as the optimum SN ratio setting value (S62). It is determined whether the optimum SN ratio setting has been performed for all watchable channels (S63). If not, selection of an arbitrary channel N+1 is designated (S64), and the process returns to step S53 in which channel selection is performed. When it is determined that the optimum SN ratio setting has been performed for all watchable channels, receiving apparatus 200 is powered off (S65). For the next watching, the tuning frequency of intermediate frequency filters 106, 110 is set to the one providing the optimum SN ratio measurement value that is set in step S62 for the arbitrary channel N.

In this way, when the receiver is powered off, the tuning frequency of the intermediate frequency filters is adjusted for an arbitrary reception channel so that the tuning frequency is appropriate for the reception environment such as a change in influence of an adjacent channel, and accordingly favorable reception characteristics are obtained all the time when watching is resumed.

Tenth Embodiment

Figure 17:
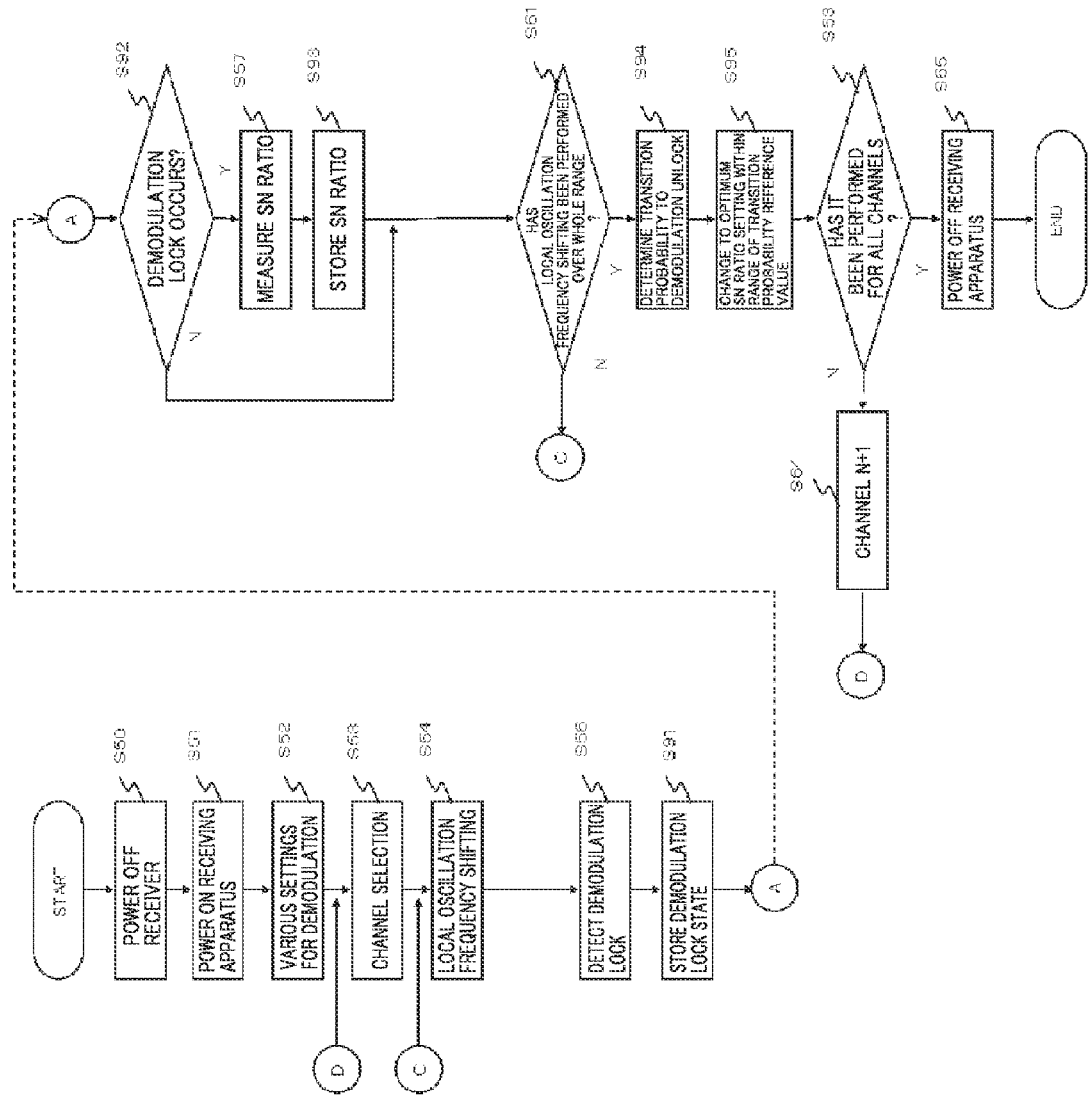

A description will be given with reference to FIGS. 7 and 17 of a method of setting the SN ratio to an optimum value in consideration of frequency shifting of the local oscillation frequency in a reception channel as well as the transition probability from the demodulation lock state to the demodulation unlock state resultant from the frequency shifting. FIG. 17 is a flowchart illustrating setting of the SN ratio to an optimum one in the present embodiment. As a criterion for the determination of the transition probability, the criterion described in connection with the third embodiment is used.

After a receiver (not shown) is powered off (S50), receiving apparatus 300 is still kept powered (S51). Then, various settings for demodulation, detection of the demodulation lock, and measurement of the SN ratio for example are performed (S52). Then, from all watchable channels, an arbitrary channel N is selected (S53). Then, for the selected channel, oscillation frequency shifting of local oscillator 120 is performed. For example, the oscillation frequency is shifted higher or lower by an interval of 142.86 kHz (S54). After the local oscillation frequency is shifted, the demodulation lock is detected (S56). The result of detection of the demodulation lock state or unlock state is stored (S91). It is determined, each time the local oscillation frequency is shifted, whether the demodulation lock occurs (S92). When it is determined that the demodulation lock state occurs, the SN ratio is measured (S57), and the SN ratio measurement value and the shift amount of the local oscillation frequency with which the measurement value has been obtained are stored (S93). When it is determined that the demodulation unlock state occurs, steps S57 and S93 are skipped, and the determination in S61 as described below is made. It is determined whether the oscillation frequency shifting of local oscillator 120 has been performed over the whole shift range (S61). If not, the process returns to step S54 in which shifting of the local oscillation frequency is performed. When it is determined in step S61 that shifting of the local oscillation frequency has been performed over the whole shift range, for the shift amount stored in step S93, the transition probability from the demodulation lock state to the demodulation unlock state is determined (S94). A predetermined reference range for the determination of the transition probability is compared with the result of determination of the transition probability in S94, and a shift amount providing an optimum SN ratio in the reference range is set as an optimum SN ratio setting value (S95). It is determined whether the optimum SN ratio setting has been performed for all watchable channels (S63). If not, selection of an arbitrary channel N+1 is designated (S64), and the process returns to step S53 in which channel selection is performed. When it is determined that the optimum SN ratio setting has been performed for all watchable channels, receiving apparatus 300 is powered off (S65). For the next watching, the local oscillation frequency is set to the one providing the SN ratio measurement value that is optimum in the reference range of the determination of the transition probability that is set in S95 for arbitrary channel N.

In this way, when the receiver is powered off, the local oscillation frequency is adjusted for an arbitrary reception channel so that the local oscillation frequency is appropriate for the reception environment such as a change in influence of an adjacent channel, in consideration of drift of the local oscillation frequency specific to the receiving apparatus, and accordingly favorable reception characteristics are obtained all the time when watching is resumed.

Eleventh Embodiment

Figure 18:
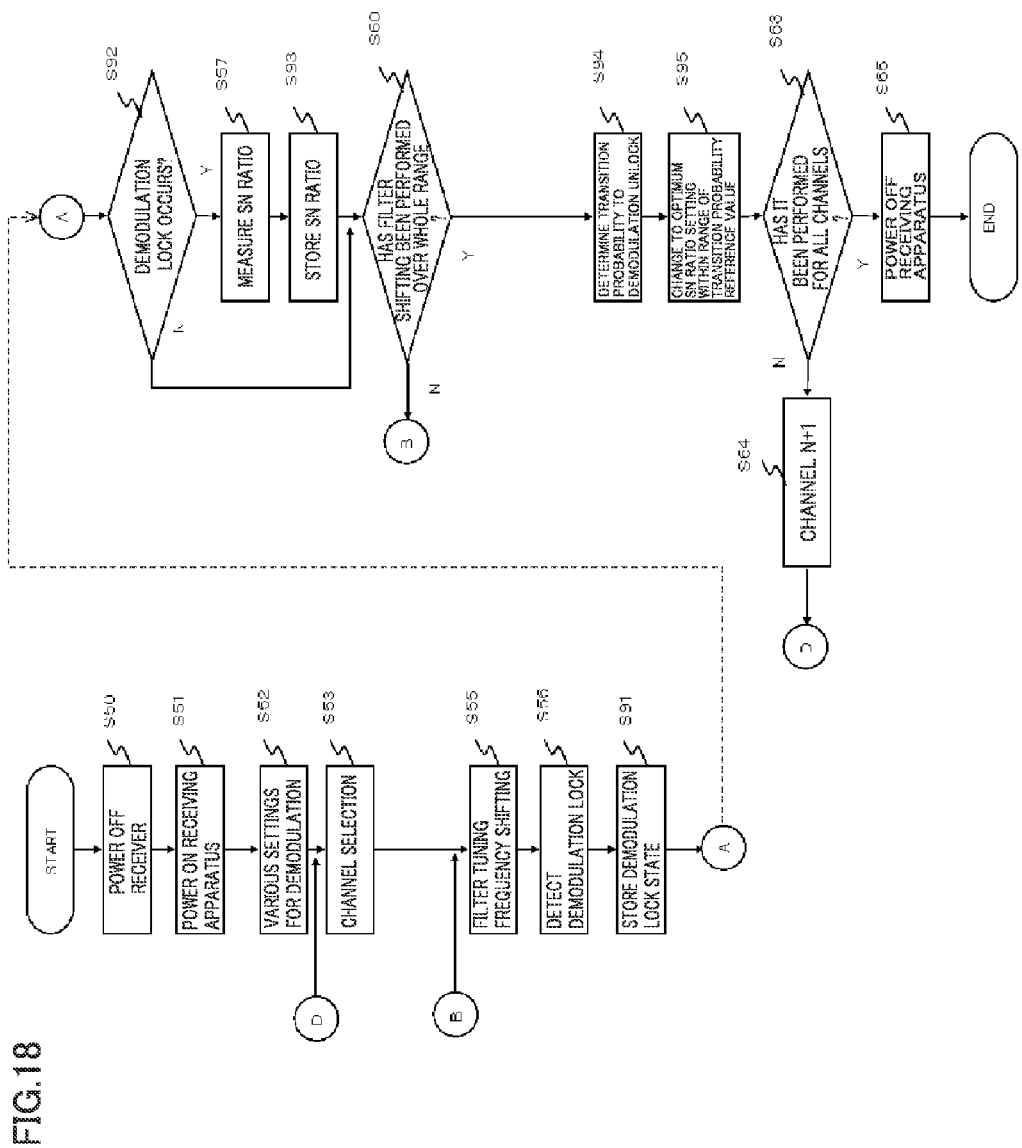
Figure 19:
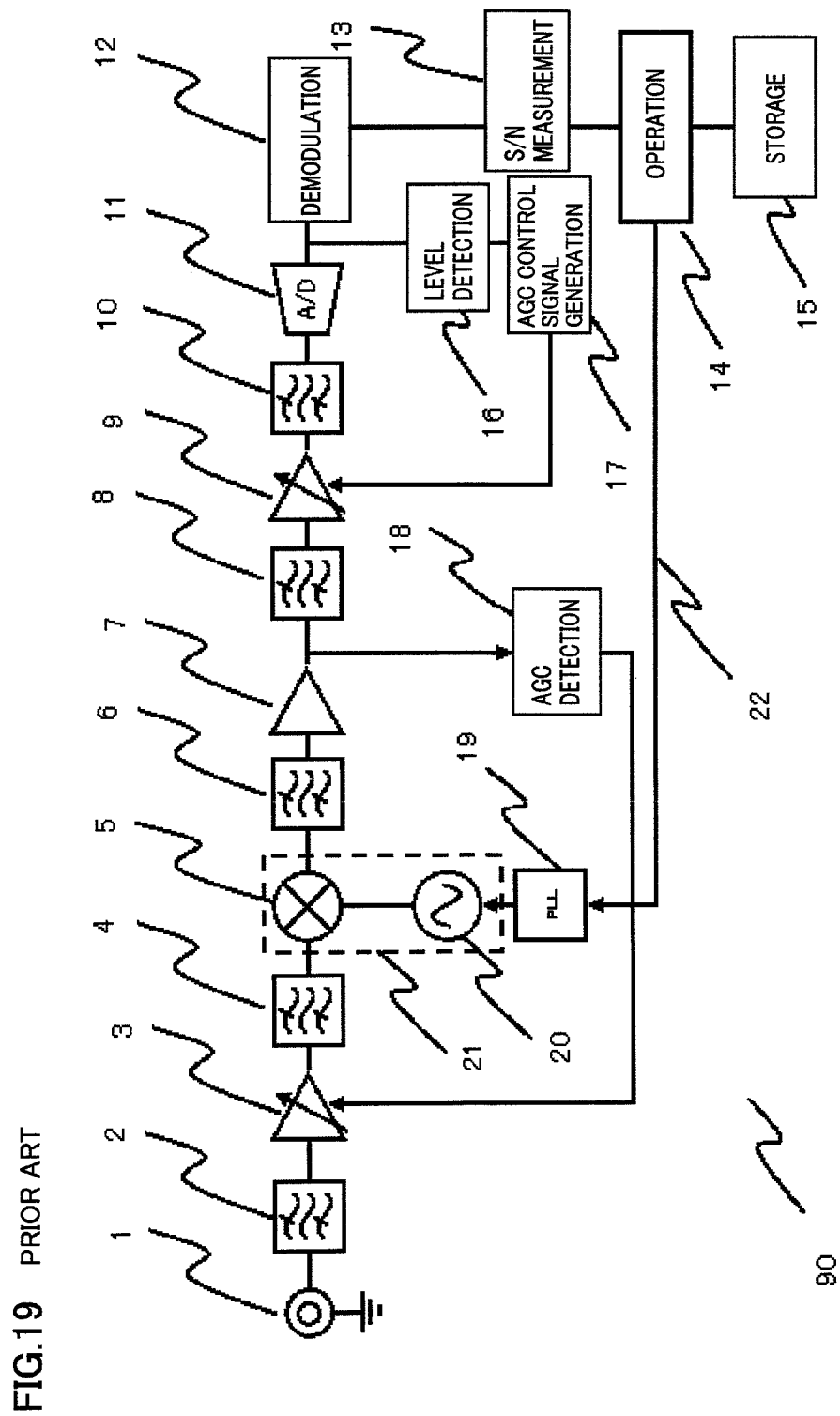
FIG. 19 is a block diagram showing a conventional television broadcast receiving apparatus.
Figure 20:
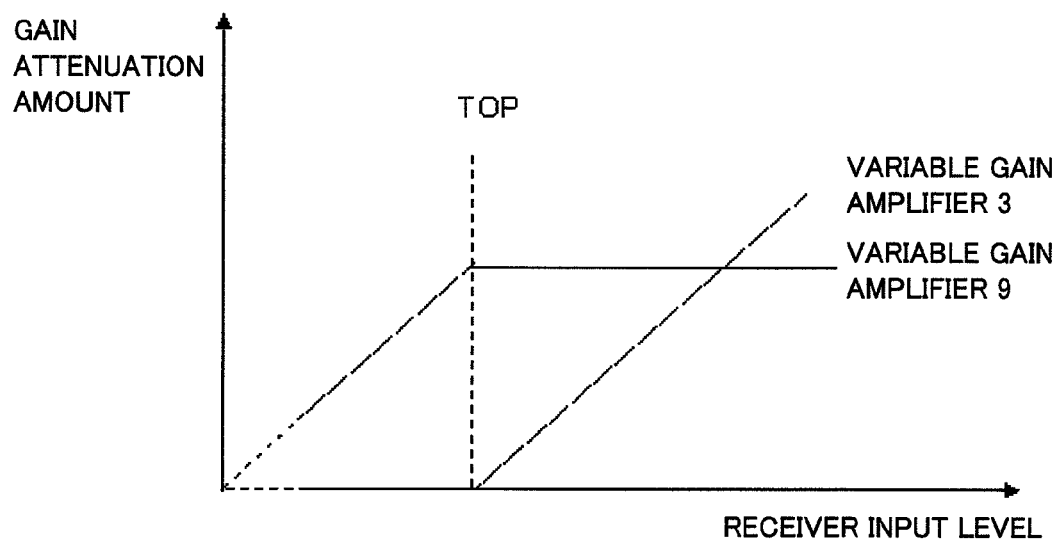
FIG. 20 illustrates a conventional general takeover point.
Figure 21:
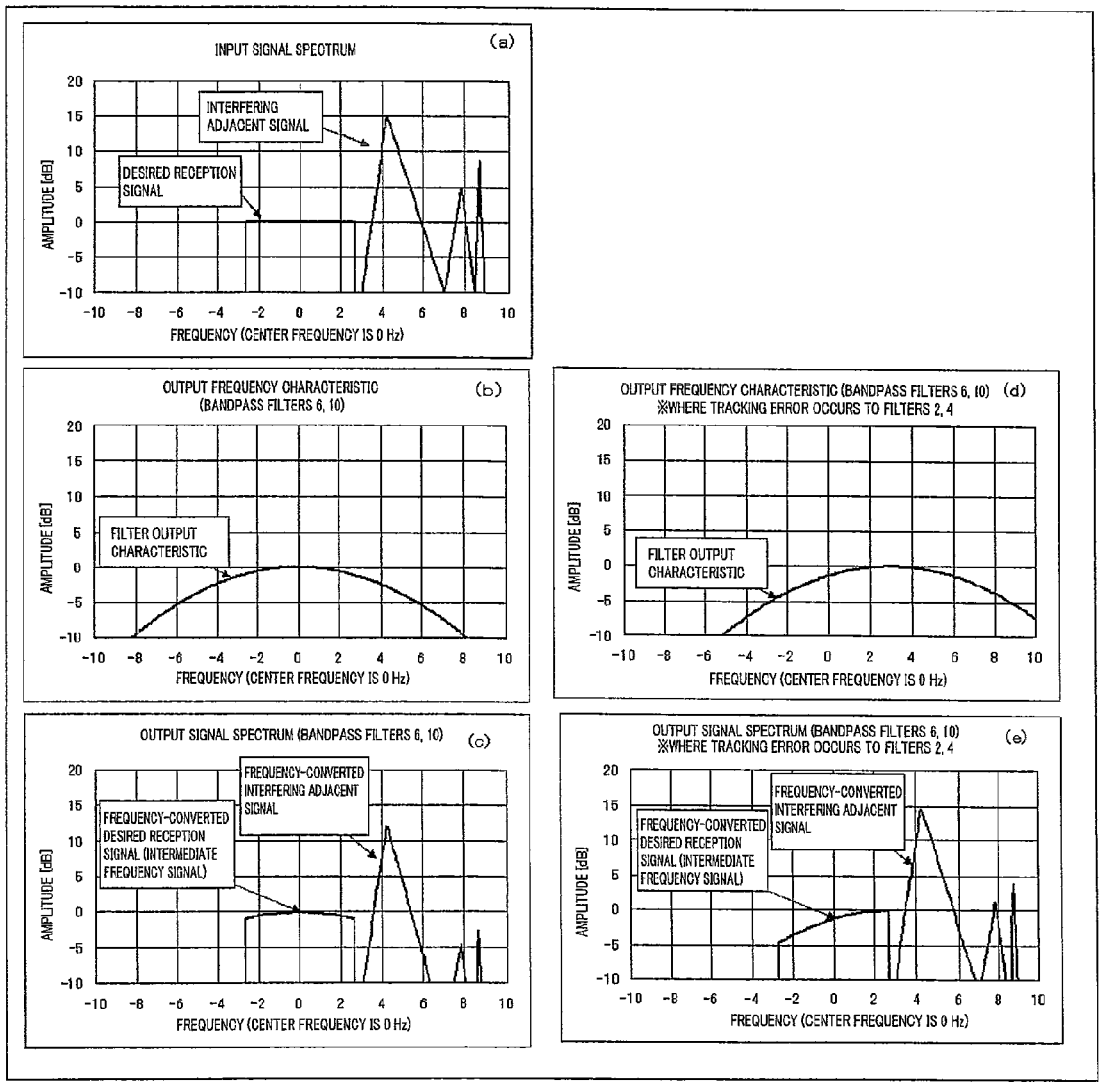
FIG. 21 illustrates an influence of an interfering adjacent signal for a conventional television broadcast receiving apparatus.

A description will be given with reference to FIGS. 8 and 18 of a method of setting the SN ratio to an optimum value in consideration of tuning frequency shifting of the intermediate frequency filters in a reception channel as well as the transition probability from the demodulation lock state to the demodulation unlock state resultant from the tuning frequency shifting.

After a receiver (not shown) is powered off (S50), receiving apparatus 400 is still kept powered (S51). Then, various settings for demodulation, detection of the demodulation lock, and measurement of the SN ratio for example are performed (S52). Then, from all watchable channels, an arbitrary channel N is selected (S53). Then, for the selected channel, tuning frequency shifting of intermediate frequency filters 106, 110 is performed. For example, the tuning frequency is shifted higher or lower by an interval of 100 kHz (S55). After the tuning frequency of the intermediate frequency filters is shifted, the demodulation lock is detected (S56). The result of detection of the demodulation lock state or unlock state is stored (S91). It is determined, each time the tuning frequency of the intermediate frequency filters is shifted, whether the demodulation lock occurs (S92). When it is determined that the demodulation lock state occurs, the SN ratio is measured (S57), and the SN ratio measurement value and the shift amount of the tuning frequency with which the measurement value has been obtained are stored (S93). When it is determined that the demodulation unlock state occurs, steps S57 and S93 are skipped, and the determination in S60 as described below is made. It is determined whether the tuning frequency shifting of intermediate frequency filters 106, 110 has been performed over the whole shift range (S60). If not, the process returns to step S55 in which shifting of the tuning frequency is performed. When it is determined in step S60 that shifting of the tuning frequency has been performed over the whole shift range, for the shift amount stored in step S93, the transition probability from the demodulation lock state to the demodulation unlock state is determined (S94). A predetermined reference range for the determination of the transition probability is compared with the result of determination of the transition probability in S94, and a shift amount providing an optimum SN ratio in the reference range for the determination of the transition probability is set as an optimum SN ratio setting value (S95). It is determined whether the optimum SN ratio setting has been performed for all watchable channels (S63). If not, selection of an arbitrary channel N+1 is designated (S64), and the process returns to step S53 in which channel selection is performed. When it is determined that the optimum SN ratio setting has been performed for all watchable channels, receiving apparatus 400 is powered off (S65). For the next watching, the tuning frequency of the intermediate frequency filters is set to the one providing the SN ratio measurement value that is optimum in the reference range of the determination of the transition probability that is set in S95 for arbitrary channel N.

In this way, when the receiver is powered off, the tuning frequency of the intermediate frequency filters is adjusted for an arbitrary reception channel so that the tuning frequency is appropriate for the reception environment such as a change in influence of an adjacent channel, in consideration of drift of the tuning frequency and drift of the amplitude of the intermediate frequency filters specific to the receiving apparatus, and accordingly favorable reception characteristics are obtained all the time when watching is resumed.

The above-described methods of setting the SN ratio to an optimum value for a television broadcast receiving apparatus may be computer-executable control programs. These programs may be stored, for example, on a computer-readable recording medium such as magnetic tape or cassette tape, magnetic disk like Floppy® disk or hard disk, optical disk like CD-ROM, MO, MD, DVD, or CD-R, IC card, or semiconductor memory like mask ROM, EPROM, EEPROM, or flash ROM. The television broadcast receiving apparatus may include communication means connectable to a communication network to download the control program from the communication network via the communication means.

According to the present invention, in a television broadcast receiving apparatus, based on a measured SN ratio of a desired reception channel, the center frequency of the intermediate frequency signal or the tuning frequency of the intermediate frequency filters for the intermediate frequency signal is adjusted, and accordingly an interfering signal present outside the band of the desired reception channel can be suppressed, and the SN ratio can be set to an optimum value in accordance with receiving conditions. The present invention can appropriately be used for a television broadcast receiving apparatus for which high reception characteristics for multi-channel reception are required.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A television broadcast receiving apparatus comprising:
a PLL (Phase Lock Loop) unit outputting a frequency control signal for controlling a frequency of a local oscillation signal in a reception channel;
a frequency conversion unit receiving said frequency control signal from said PLL unit and generating an intermediate frequency signal by using said local oscillation signal;
a filter unit configured to be tuned to a frequency band of said intermediate frequency signal;
a demodulation unit demodulating the intermediate frequency signal passed through said filter unit and outputting the demodulated signal;
a demodulation lock detection unit detecting a lock state or an unlock state of said demodulation unit;
an SN ratio measurement unit measuring an SN (Signal to Noise) ratio of said demodulated signal; and
an operation unit controlling said PLL unit, wherein
said operation unit determining the frequency of said local oscillation signal that renders said SN ratio favorable in a range corresponding to an occupied frequency bandwidth of said reception channel and, based on a result of the determination, changing said frequency control signal for said local oscillation signal that is output from said PLL unit, and
from a result of the detection of said demodulation lock detection unit, said operation unit determines a transition probability from the lock state to the unlock state, and said operation unit selects an optimum setting of said SN ratio from frequencies of said local oscillation signal that provide respective transition probabilities falling within a predetermined range.

2. The television broadcast receiving apparatus according to claim 1, further comprising a storage unit temporarily storing said SN ratio and setting data about the frequency of said local oscillation signal that renders said SN ratio optimum.

* * * * *